US012757564B2

(12) United States Patent
Kim et al.

(10) Patent No.: US 12,757,564 B2
(45) Date of Patent: Oct. 6, 2026

(54) PHOTOSENSOR AND SENSOR EMBEDDED DISPLAY PANEL AND ELECTRONIC DEVICE

(71) Applicant: Samsung Electronics Co., Ltd., Suwon-si (KR)

(72) Inventors: Hyeong-Ju Kim, Suwon-si (KR); Chul Joon Heo, Suwon-si (KR); Kyung Bae Park, Suwon-si (KR); Feifei Fang, Suwon-si (KR); Hwijoung Seo, Suwon-si (KR); Hiromasa Shibuya, Suwon-si (KR); Sungyoung Yun, Suwon-si (KR); Tae Jin Choi, Suwon-si (KR); Hyerim Hong, Suwon-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 514 days.

(21) Appl. No.: 18/317,400

(22) Filed: May 15, 2023

(65) Prior Publication Data

US 2024/0057438 A1 Feb. 15, 2024

(30) Foreign Application Priority Data

Aug. 2, 2022 (KR) ........................ 10-2022-0096225

(51) Int. Cl.
*H10K 59/40* (2023.01)
*H10K 39/00* (2026.01)
(Continued)

(52) U.S. Cl.
CPC ........... *H10K 39/34* (2023.02); *H10K 39/501* (2023.02); *H10K 59/60* (2023.02); *H10K 59/65* (2023.02);
(Continued)

(58) Field of Classification Search
CPC ........ H10K 59/60; H10K 59/65; H10K 39/32; H10K 39/34; H10K 65/00; H10K 2101/40
See application file for complete search history.

(56) References Cited

U.S. PATENT DOCUMENTS 8,525,577 B2 9/2013 Yofu et al.
9,490,442 B2 11/2016 Leem et al.
(Continued)

FOREIGN PATENT DOCUMENTS

EP 3848374 A1 7/2021
JP 6927887 B2 9/2021
(Continued)

OTHER PUBLICATIONS

European Patent Office, Search Opinion, EPO Application No. 23183813.7, Dec. 13, 2023, all pages. (Year: 2023).*
(Continued)

*Primary Examiner* — Victoria K. Hall
(74) *Attorney, Agent, or Firm* — HARNESS, DICKEY & PIERCE, P.L.C.

(57) ABSTRACT

A sensor-embedded display panel includes a light emitting element on a substrate and including a light emitting layer, and a photosensor on the substrate and including a photosensitive layer extending at least partially in parallel with the light emitting layer along an in-plane direction of the substrate. The light emitting element and the photosensor include separate, respective portions of each of first and second common auxiliary layers each extending continuously as a single piece of material under and on, respectively, each of the light emitting layer and the photosensitive layer. The photosensitive layer may include a light absorbing semiconductor having a HOMO energy level having a difference of less than about 1.0 eV from a HOMO energy level of the first common auxiliary layer and a LUMO
(Continued)

energy level having a difference of less than about 1.0 eV from a LUMO energy level of the second common auxiliary layer.

15 Claims, 6 Drawing Sheets

(51) Int. Cl.
*H10K 39/34* (2023.01)
*H10K 59/60* (2023.01)
*H10K 59/65* (2023.01)
*H10K 65/00* (2023.01)
*H10K 50/852* (2023.01)
*H10K 59/35* (2023.01)
*H10K 59/80* (2023.01)
*H10K 101/30* (2023.01)
*H10K 101/40* (2023.01)

(52) U.S. Cl.
CPC ........... *H10K 65/00* (2023.02); *H10K 50/852* (2023.02); *H10K 59/352* (2023.02); *H10K 59/353* (2023.02); *H10K 59/40* (2023.02); *H10K 59/876* (2023.02); *H10K 2101/30* (2023.02); *H10K 2101/40* (2023.02)

(56) References Cited

U.S. PATENT DOCUMENTS

| | | | | |
|---|---|---|---|---|
| 9,502,593 | B2 | 11/2016 | Kim et al. | |
| 11,239,298 | B2 | 2/2022 | Di et al. | |
| 11,804,064 | B2 | 10/2023 | Kusunoki et al. | |
| 12,243,345 | B2 | 3/2025 | Kusunoki et al. | |
| 2014/0159022 | A1* | 6/2014 | Song | H10K 59/876 257/40 |
| 2015/0287946 | A1* | 10/2015 | Leem | C07F 5/022 257/40 |
| 2016/0020258 | A1* | 1/2016 | Park | H10K 39/00 257/40 |
| 2016/0064460 | A1 | 3/2016 | Kim et al. | |
| 2018/0076267 | A1* | 3/2018 | Song | H10K 59/876 |
| 2020/0152703 | A1* | 5/2020 | Park | H10K 30/82 |
| 2021/0139643 | A1 | 5/2021 | Araki et al. | |
| 2021/0234103 | A1 | 7/2021 | Lim et al. | |
| 2022/0041628 | A1 | 2/2022 | Park et al. | |
| 2022/0216418 | A1 | 7/2022 | Choi et al. | |
| 2022/0261584 | A1 | 8/2022 | Heo et al. | |
| 2022/0327857 | A1* | 10/2022 | Kusunoki | G06V 40/1318 |
| 2024/0074272 | A1* | 2/2024 | Kubota | H10K 59/65 |

FOREIGN PATENT DOCUMENTS

| | | | | |
|---|---|---|---|---|
| KR | 10-2015-0115477 A | 10/2015 | | |
| KR | 102265752 B1 | 6/2021 | | |
| KR | 2022-0017639 A | 2/2022 | | |
| KR | 10-2022-0069031 A | 5/2022 | | |
| WO | WO-2017/126401 A1 | 7/2017 | | |
| WO | WO2019128849 A1 * | 7/2019 | | C07D 307/91 |
| WO | WO-2021/059069 A1 | 4/2021 | | |

OTHER PUBLICATIONS

Machine translation, Yang, WIPO Pat. Pub. No. WO2019128849A1, translation date: Mar. 22, 2026, Clarivate Analytics, all pages. (Year: 2026).*

Natalia Terenti et al., "Structure-properties of small donor-acceptor molecules for homojunction single-material organic solar cells", Journal of Materials Chemistry C, vol. 10, No. 14, pp. 5716-5726, 2022.

Extended European Search Report dated Dec. 13, 2023 for corresponding European Application No. 23183813.7.

Office Action issued in Corresponding European Patent Application No. 23183813.7, dated Oct. 20, 2025.

Korean Office Action dated Jan. 9, 2026 issued in corresponding Korean Patent Application No. 10-2022-0096225, with English Translation thereof.

* cited by examiner

PHOTOSENSOR AND SENSOR EMBEDDED DISPLAY PANEL AND ELECTRONIC DEVICE

CROSS-REFERENCE TO RELATED APPLICATION

This application claims priority to and the benefit of Korean Patent Application No. 10-2022-0096225 filed in the Korean Intellectual Property Office on Aug. 2, 2022, the entire contents of which are incorporated herein by reference.

BACKGROUND

1. Field

Example embodiments of the inventive concepts are directed to photosensors, sensor-embedded display panels, and electronic devices.

2. Description of the Related Art

Recently, there is an increasing demand for a display device implementing a biometric recognition technology that authenticates the person by extracting specific biometric information or behavioral characteristic information of a person with an automated device centering on finance, healthcare, and mobile. Accordingly, the display device may include a sensor for biometric recognition.

On the other hand, such a sensor for biometric recognition may be divided into an electrostatic type, an ultrasonic type, or an optical type. Among them, the optical type sensor is a sensor configured to absorb light and convert the absorbed light into an electrical signal. The organic material has a large extinction coefficient and may be configured to selectively absorb light in a specific wavelength spectrum depending on a molecular structure, and thus it may be usefully applied to an optical type sensor.

SUMMARY

The sensor provided in the display device may be disposed under the display panel or may be manufactured as a separate module and mounted on the outside of the display panel. However, when the sensor is disposed under the display panel, the object such as a fingerprint should be recognized through the display panel, various films, and/or parts, and thus performance may be degraded. When the sensor is manufactured and mounted as a separate module, there are limitations in terms of design and usability. Accordingly, an embedded sensor in which a sensor is embedded in the display panel may be proposed. However, since the performance and physical properties required for the display panel and the sensor are different from each other, it is difficult to implement in an integrated form.

Some example embodiments provide a photosensor with good optical and electrical performance.

Some example embodiments provide a sensor-embedded display panel including the photosensor integrated with a display panel to improve performance.

Some example embodiments provide an electronic device including the photosensor or the sensor-embedded display panel.

According to some example embodiments, a sensor-embedded display panel may include a light emitting element on a substrate and including a light emitting layer, and a photosensor on the substrate and including a photosensitive layer, the photosensitive layer extending at least partially in parallel with the light emitting layer along an in-plane direction of the substrate, wherein the light emitting element and the photosensor each include a separate portion of a first common auxiliary layer extending continuously as a single piece of material under each of the light emitting layer and the photosensitive layer, and a separate portion of a second common auxiliary layer extending continuously as a single piece of material on each of the light emitting layer and the photosensitive layer. The photosensitive layer may include a light absorbing semiconductor having a HOMO energy level having a difference of less than about 1.0 eV from a HOMO energy level of the first common auxiliary layer and a LUMO energy level having a difference of less than about 1.0 eV from a LUMO energy level of the second common auxiliary layer. The photosensitive layer may not include any counterpart semiconductor for any pn junction with the light absorbing semiconductor.

The photosensitive layer may be a single layer formed of a single continuous phase of the light absorbing semiconductor.

The photosensitive layer may be formed of the light absorbing semiconductor.

An energy bandgap of the photosensitive layer may be narrower than each of an energy bandgap of the first common auxiliary layer and an energy bandgap of the second common auxiliary layer.

The light absorbing semiconductor may be configured to selectively absorb light of a red wavelength spectrum, a green wavelength spectrum, a blue wavelength spectrum, an infrared wavelength spectrum, or any combination thereof.

The photosensitive layer and the second common auxiliary layer may be in contact with each other.

The photosensitive layer and the first common auxiliary layer may be in contact with each other.

The light absorbing semiconductor may be an organic light absorbing material including an electron donating moiety and an electron accepting moiety.

The light emitting layer may include an organic light emitting material and a difference between respective sublimation temperatures of the organic light absorbing material and the organic light emitting material may be greater than or equal to about 0° C. and less than about 100° C.

The sensor-embedded display panel may further include a first pixel electrode included in the light emitting element and disposed under the first common auxiliary layer, a second pixel electrode included in the photosensor and disposed under the first common auxiliary layer, and a common electrode facing the first pixel electrode and the second pixel electrode, respectively, and configured to apply a common voltage to the light emitting element and the photosensor, wherein the common electrode may include a semi-transmissive layer forming a microcavity with the first and second pixel electrodes, respectively.

The sensor-embedded display panel may further include an optical auxiliary layer between the photosensitive layer and the first common auxiliary layer.

The optical auxiliary layer may be thicker than the photosensitive layer.

The photosensitive layer may be configured to selectively absorb light of a first wavelength spectrum that is one of a red wavelength spectrum, a green wavelength spectrum, a blue wavelength spectrum, an infrared wavelength spectrum, or any combination thereof, and the optical auxiliary layer may have a thickness which configures the photosensor to have a resonance wavelength belonging to the first wavelength spectrum.

The light emitting element may include first, second, and third light emitting elements configured to emit light of different wavelength spectra from each other, and the photosensor may be configured to absorb light that is emitted from at least one of the first, second, or third light emitting elements and then reflected by a recognition target and convert the absorbed light into an electrical signal.

The sensor-embedded display panel may include a display area configured to display a color and a non-display area excluding the display area, and the light emitting element may be in the display area and the photosensor may be in the non-display area.

The light emitting element may include a first light emitting element configured to emit light of a red wavelength spectrum, a second light emitting element configured to emit light of a green wavelength spectrum, and a third light emitting element configured to emit light of a blue wavelength spectrum, the display area may include a plurality of first subpixels configured to display light of the red wavelength spectrum and including the first light emitting element, a plurality of second subpixels configured to display light of the green wavelength spectrum and including the second light emitting element, and a plurality of third subpixels configured to display light of the blue wavelength spectrum and including the third light emitting element, and the photosensor may be between at least two subpixels of a first subpixel of the plurality of first subpixels, a second subpixel of the plurality of second subpixels, or a third subpixel of the plurality of third subpixels.

According to some example embodiments, a photosensor may include an anode, a hole auxiliary layer on the anode, a single photosensitive layer on the hole auxiliary layer, an electron auxiliary layer on the single photosensitive layer, the electron auxiliary layer being in contact with the single photosensitive layer, and a cathode on the electron auxiliary layer, wherein the single photosensitive layer may include a single light absorbing semiconductor having a HOMO energy level having a difference of less than about 1.0 eV from a HOMO energy level of the hole auxiliary layer and a LUMO energy level having a difference of less than about 1.0 eV from a LUMO energy level of the electron auxiliary layer. The single photosensitive layer may not include any counterpart semiconductor for any pn junction with the single light absorbing semiconductor.

An energy bandgap of the single photosensitive layer may be narrower than each of an energy bandgap of the hole auxiliary layer and an energy bandgap of the electron auxiliary layer. The photosensor may further include an optical auxiliary layer between the single photosensitive layer and the first common auxiliary layer, wherein the optical auxiliary layer may be thicker than the single photosensitive layer.

According to some example embodiments, an electronic device including the sensor-embedded display panel or the photosensor is provided.

A sensor with improved optical and electrical performance and process stability may be integrated into the display panel, thereby realizing a high-performance sensor while improving design and usability.

DETAILED DESCRIPTION

Figure 1:
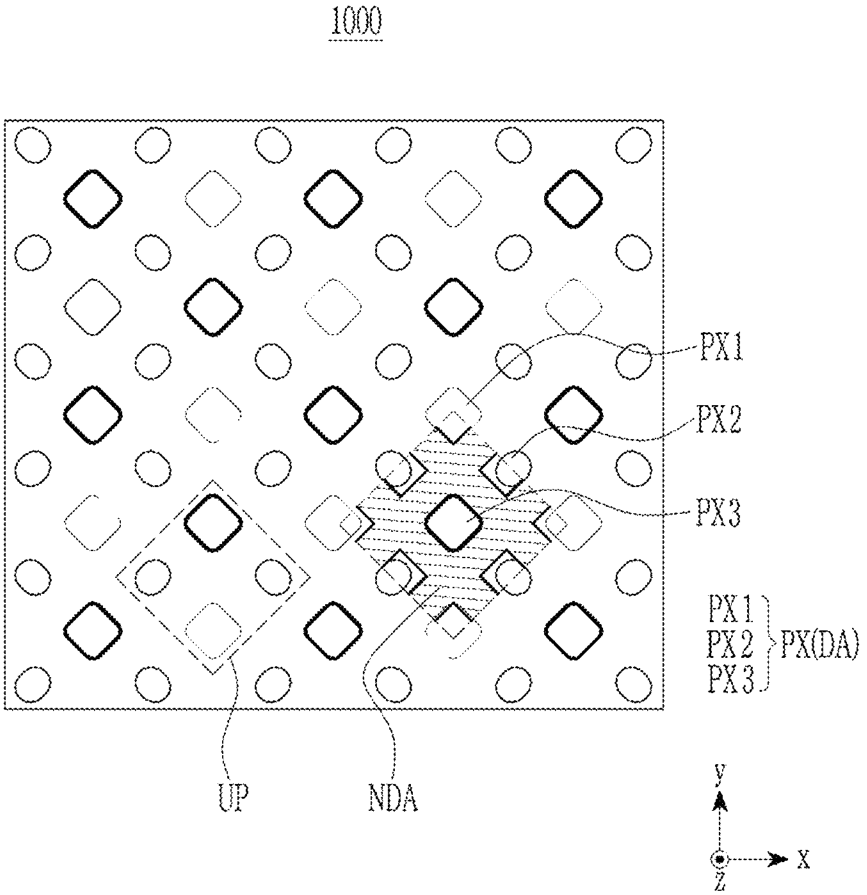
FIG. 1 is a plan view showing an example of a sensor-embedded display panel according to some example embodiments.

Hereinafter, example embodiments will be described in detail so that a person skilled in the art would understand the same. However, a structure that is actually applied may be implemented in various different forms and is not limited to some example embodiments described herein.

In the drawings, the thickness of layers, films, panels, regions, etc., are exaggerated for clarity. It will be understood that when an element such as a layer, film, region, or substrate is referred to as being "on" another element, it may be directly on the other element or intervening elements may also be present. In contrast, when an element is referred to as being "directly on" another element, there are no intervening elements present.

In the drawings, parts having no relationship with the description are omitted for clarity of some example embodiments, and the same or similar constituent elements are indicated by the same reference numeral throughout the specification.

Hereinafter, the terms "lower" and "upper" are used for better understanding and ease of description, but do not limit the location relationship.

As used herein, when a definition is not otherwise provided, "substituted" refers to replacement of hydrogen of a compound by a substituent of a halogen, a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C30 alkyl group, a C2 to C30 alkenyl group, a C2 to C30 alkynyl group, a C6 to C30 aryl group, a C7 to C30 arylalkyl group, a C1 to C30 alkoxy group, a C1 to C20 heteroalkyl group, a C3 to C20 heterocyclic group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, or any combination thereof.

As used herein, when a definition is not otherwise provided, "hetero" refers to one including 1 to 4 heteroatoms of N, O, S, Se, Te, Si, or P.

As used herein, when a definition is not otherwise provided, "aromatic ring" refers to a functional group in which all atoms in the cyclic functional group have a p-orbital, and wherein these p-orbitals are conjugated.

Hereinafter, when a definition is not otherwise provided, a work function or an energy level is expressed as an absolute value from a vacuum level. In addition, when the work function or the energy level is referred to be deep, high, or large, it may have a large absolute value based on "0 eV"

of the vacuum level while when the work function or the energy level is referred to be shallow, low, or small, it may have a small absolute value based on "0 eV" of the vacuum level. Further, the differences between the work function and/or the energy level may be values obtained by subtracting a small value of the absolute value from a large value of the absolute value.

Hereinafter, when a definition is not otherwise provided, the HOMO energy level may be evaluated with an amount of photoelectrons emitted by energy when irradiating UV light to a thin film using AC-2 (Hitachi) or AC-3 (Riken Keiki Co., Ltd.).

Hereinafter, when a definition is not otherwise provided, the LUMO energy level may be obtained by obtaining an energy bandgap using a UV-Vis spectrometer (Shimadzu Corporation), and then calculating the LUMO energy level from the energy bandgap and the already measured HOMO energy level.

It will further be understood that when an element is referred to as being "on" another element, it may be above or beneath or adjacent (e.g., horizontally adjacent) to the other element. It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof. Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%). Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%). Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%). It will be understood that elements and/or properties thereof may be recited herein as being "identical" to, "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same. It will be understood that elements and/or properties thereof described herein as being "substantially" the same and/or identical encompasses elements and/or properties thereof that have a relative difference in magnitude that is equal to or less than 10%.

Further, regardless of whether elements and/or properties thereof are modified as "substantially," it will be understood that these elements and/or properties thereof should be construed as including a manufacturing or operational tolerance (e.g., ±10%) around the stated elements and/or properties thereof. While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%). When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the inventive concepts. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Hereinafter, a sensor-embedded display panel according to some example embodiments will be described.

The sensor-embedded display panel according to some example embodiments may be a display panel capable of performing a display function and a recognition function (e.g., biometric recognition function), and may be an in-cell type display panel in which a sensor performing a recognition function (e.g., biometric recognition function) is embedded in the display panel.

Figure 2:
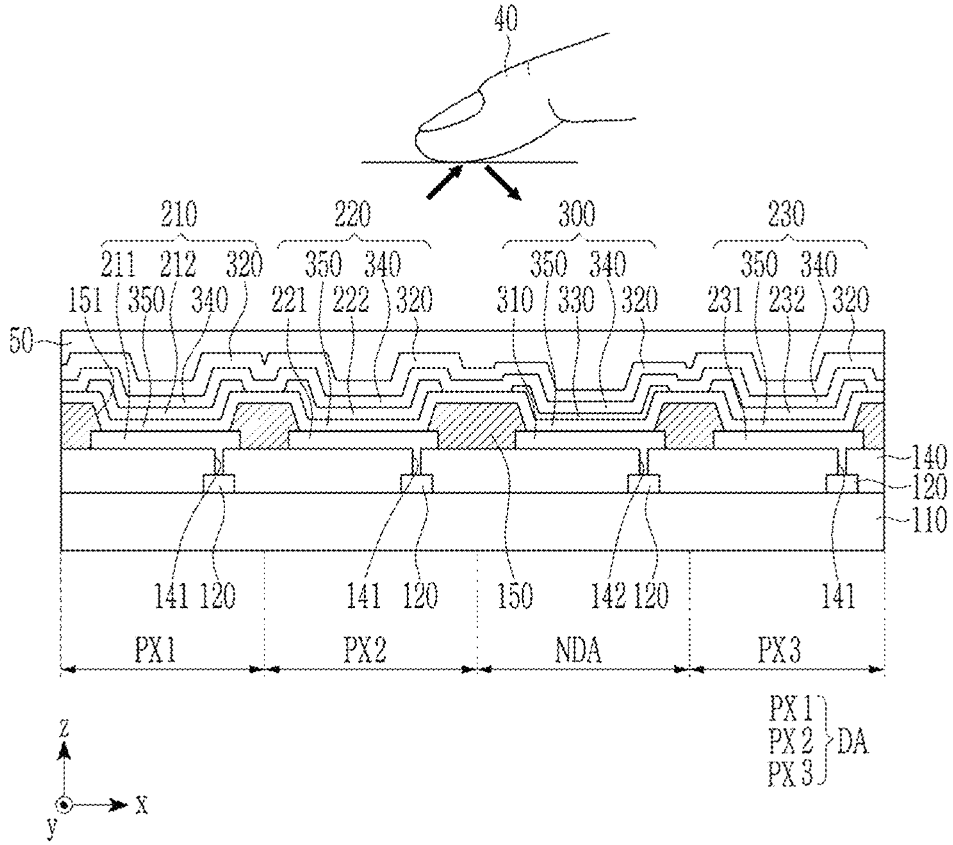
FIG. 2 is a cross-sectional view illustrating an example of a sensor-embedded display panel according to some example embodiments.

FIG. 1 is a plan view illustrating an example of a sensor-embedded display panel according to some example embodiments, and FIG. 2 is a cross-sectional view illustrating an example of a sensor-embedded display panel according to some example embodiments.

Referring to FIGS. 1 and 2, a sensor-embedded display panel 1000 according to some example embodiments includes a plurality of subpixels PXs configured to display different colors from each other. The plurality of subpixels PXs may be configured to display at least three primary colors, for example, a first subpixel PX1, a second subpixel PX2, and a third subpixel PX3 configured to display different first color, second color, and third color selected from red, green, and blue. For example, the first color, the second color, and the third color may be red, green, and blue, respectively. The first subpixel PX1 may be a red subpixel configured to display red, the second subpixel PX2 may be a green subpixel configured to display green, and the third subpixel PX3 may be a blue subpixel configured to display blue. However, the present inventive concepts are not limited thereto, and an auxiliary subpixel (not shown) such as a white subpixel may be further included. Displaying a color may refer to emitting light corresponding to the color (e.g., light in a wavelength spectrum of the color). Referring to FIG. 1, the sensor-embedded display panel 1000 may include a plurality of first subpixels PX1 configured to display a red color (e.g., light of a red wavelength spectrum) and including a first light emitting element (e.g., the first light emitting element 210 shown in FIG. 2), a plurality of second subpixels PX2 configured to display a green color (e.g., light of a green wavelength spectrum) and including a second light emitting element (e.g., the second light emitting element 220 shown in FIG. 2), and a plurality of third subpixels PX3 configured to display a blue color (e.g., light of a blue wavelength spectrum) and including a third light emitting element (e.g., the third light emitting element 230 shown in FIG. 2), where the first subpixels PX1, the second subpixels PX2, and the third subpixels PX3 are located in and/or at least partially define the display area (DA).

The plurality of subpixels PXs including the first subpixel PX1, the second subpixel PX2, and the third subpixel PX3 may constitute (e.g., define) one unit pixel UP to be arranged repeatedly along the row and/or column. In FIG. 1, a structure including one first subpixel PX1, two second subpixels PX2, and one third subpixel PX3 in the unit pixel UP is illustrated, but the present inventive concepts are not limited thereto. At least one first subpixel PX1, at least one second subpixel PX2, or at least one third subpixel PX3 may be included in the unit pixel UP. In the drawing, as an example, an arrangement of a Pentile type is illustrated, but the present inventive concepts are not limited thereto and the arrangement of the sub-pixels PX may be varied. An area occupied by the plurality of subpixels PXs and configured to display colors by the plurality of subpixels PXs may be a display area DA configured to display an image. For example, the area (e.g., in the xy plane) of the subpixels (PX) may collectively define the display area (DA) that is configured to display an image thereon (e.g., configured to display one or more colors). A portion of the area (e.g., in the xy plane) of the sensor-embedded display panel 1000 that excludes the display area (DA) (e.g., portions of the area of the sensor-embedded display panel 1000 that are between adjacent subpixels (PX) in the xy direction, xy plane, etc.) may be a non-display area (NDA) that is configured to not display an image thereon (e.g., configured to not display any color).

Each of the first subpixel PX1, the second subpixel PX2, and the third subpixel PX3 may include a light emitting element. As an example, the first subpixel PX1 may include a first light emitting element 210 configured to emit light in a wavelength spectrum of a first color, the second subpixel PX2 may include a second light emitting element 220 configured to emit light in a wavelength spectrum of a second color, and the third subpixel PX3 may include a third light emitting element 230 configured to emit light in a wavelength spectrum of a third color. However, the present inventive concepts are not limited thereto, and at least one of the first subpixel PX1, the second subpixel PX2 or the third subpixel PX3, or an auxiliary subpixel (not shown) other than the first subpixel PX1, the second subpixel PX2, and the third subpixel PX3 may include a light emitting element configured to emit light of a combination of a first color, a second color, and a third color, that is, white light, and may be configured to display a first color, a second color, or a third color through a color filter (not shown) or may not be configured to display a color. Herein, the terms "wavelength spectrum" and "wavelength region" may be used interchangeably.

The sensor-embedded display panel 1000 according to some example embodiments includes a photosensor 300. The photosensor 300 may be disposed in a non-display area NDA. The non-display area NDA may be an area other than the display area DA, in which the first subpixel PX1, the second subpixel PX2, the third subpixel PX3, and auxiliary subpixels are not occupied (e.g., a portion of the total area of the sensor-embedded display panel 1000 that excludes the display area (DA), excludes the subpixels (PX), is between adjacent subpixels (PX), etc.). For example, the area (e.g., in the xy plane) of the subpixels (PX) may collectively define the display area (DA) that is configured to display an image thereon (e.g., configured to display one or more colors). A portion of the area (e.g., in the xy plane) of the sensor-embedded display panel 1000 that excludes the display area (DA) (e.g., portions of the area of the sensor-embedded display panel 1000 that are between adjacent subpixels (PX) in the xy direction, xy plane, etc.) may be a non-display area (NDA) that is configured to not display an image thereon (e.g., configured to not display any color). The photosensor 300 may be disposed between at least two subpixels selected from the first subpixel PX1, the second subpixel PX2, and the third subpixel PX3 (e.g., between at least two subpixels of a first subpixel PX1 of a plurality of first subpixels PX1, a second subpixel PX2 of the plurality of second subpixels PX2, or a third subpixel PX3 of the plurality of third subpixels PX3), and may be disposed in parallel with the first, second, and third light emitting elements 210, 220, and 230 in the display area DA, for example at last partially in parallel along the in-plane direction of the substrate 110 (e.g., the xy direction as shown), which may be a direction extending parallel to an upper surface of the substrate 110.

The photosensor 300 may be an optical type recognition sensor (e.g., a biometric sensor), and may be configured to absorb light emitted from at least one of the first, second or third light emitting elements 210, 220, or 230 in the display area DA, and then reflected by a recognition target 40 such as a living body, a tool, or an object (e.g., may be configured to absorb light of a red wavelength spectrum, a green wavelength spectrum, a blue wavelength spectrum, an infrared wavelength spectrum, or any combination thereof) to convert the absorbed light into an electrical signal. Herein, the living body may be a finger, a fingerprint, a palm, an iris, a face, and/or a wrist, but is not limited thereto. The photosensor 300 may be, for example, a fingerprint sensor, an illumination sensor, an iris sensor, a distance sensor, a blood vessel distribution sensor, and/or a heart rate sensor, but is not limited thereto.

The photosensor 300 may be disposed on the same plane as the first, second, and third light emitting elements 210, 220, and 230 on the substrate 110, and may be embedded in the sensor-embedded display panel 1000. Restated, the photosensor 300 may be at least partially in parallel with the first, second, and third light emitting elements 210, 220, and 230 on the substrate 110 along an in-plane direction of the substrate 110. As described herein, the in-plane direction of the substrate 110 may be a direction (e.g., the xy direction as shown) that extends in parallel with at least a portion of the substrate 110, including an upper surface of the substrate 110.

Referring to FIG. 2, the sensor-embedded display panel 1000 includes a substrate 110; a thin film transistor 120 on the substrate 110; an insulation layer 140 on the thin film transistor 120; a pixel definition layer 150 on the insulation layer 140; and first, second, or third light emitting elements 210, 220, or 230 and the photosensor 300 in a space partitioned by (e.g., at least partially defined by) the pixel definition layer 150.

The substrate 110 may be a light-transmitting substrate, for example, a glass substrate or a polymer substrate. The polymer substrate may include, for example, polycarbonate, polymethylmethacrylate, polyethyleneterephthalate, polyethylenenaphthalate, polyimide, polyamide, polyamideimide, polyethersulfone, polyorganosiloxane, styrene-ethylene-butylene-styrene, polyurethane, polyacrylate, polyolefin, or any combination thereof, but is not limited thereto.

A plurality of thin film transistors 120 are formed on the substrate 110. One or more thin film transistors 120 may be included in each subpixel PX, and may include, for example, at least one switching thin film transistor and/or at least one driving thin film transistor. The substrate 110 on which the thin film transistor 120 is formed may be referred to as a thin film transistor substrate (TFT substrate) or a thin film transistor backplane (TFT backplane).

The insulation layer 140 may cover the substrate 110 and the thin film transistor 120 and may be formed on the whole (e.g., entire) surface of the substrate 110. The insulation layer 140 may be a planarization layer or a passivation layer, and may include an organic insulating material, an inorganic insulating material, an organic-inorganic insulating material, or any combination thereof. The insulation layer 140 may have a plurality of contact holes 141 for connecting the first, second, and third light emitting elements 210, 220, and 230 and the thin film transistor 120 and a plurality of contact holes 142 for electrically connecting the photosensor 300 and the thin film transistor 120. The insulation layer 140 may include an organic, inorganic, or organic-inorganic insulating material, in some example embodiments, an inorganic insulating material such as silicon oxide, silicon nitride, silicon oxynitride, aluminum oxide, aluminum nitride, or aluminum oxynitride; an organic insulating material such as polyimide, polyamide, polyamideimide, or polyacrylate; or an organic-inorganic insulating material such as polyorganosiloxane or polyorganosilazane.

The pixel definition layer 150 may also be formed on the whole surface of the substrate 110 and may be between adjacent subpixels PXs to partition each subpixel PX. The pixel definition layer 150 may have a plurality of openings 151 in each subpixel PX, and in each opening 151, any one of first, second, or third light emitting elements 210, 220, or 230 or the photosensor 300. The pixel definition layer 150 may include an insulation layer that may include an organic, inorganic, or organic-inorganic insulating material, in some example embodiments, an inorganic insulating material such as silicon oxide, silicon nitride, or silicon oxynitride; an organic insulating material such as polyimide; or an organic-inorganic insulating material such as polyorganosiloxane or polyorganosilazane.

The first, second, and third light emitting elements 210, 220, and 230 are formed on the substrate 110 (or thin film transistor substrate), and are repeatedly arranged along the in-plane direction (e.g., xy direction) of the substrate 110 (also referred to as an in-plane direction of the substrate 110). As described above, the first, second, and third light emitting elements 210, 220, and 230 may be included in the first subpixel PX1, the second subpixel PX2, and the third subpixel PX3, respectively, or may define the first subpixel PX1, the second subpixel PX2, and the third subpixel PX3. The first, second, and third light emitting elements 210, 220, and 230 may be electrically connected to separate thin film transistors 120 and may be driven independently.

The first, second, and third light emitting elements 210, 220, and 230 may be configured to independently emit one light of a red wavelength spectrum, a green wavelength spectrum, a blue wavelength spectrum, an infrared wavelength spectrum, or any combination thereof. For example, the first light emitting element 210 may be configured to emit light of a red wavelength spectrum, the second light emitting element 220 may be configured to emit light of a green wavelength spectrum, and the third light emitting element 230 may be configured to emit light of a blue wavelength spectrum. Herein, the red wavelength spectrum, the green wavelength spectrum, and the blue wavelength spectrum may have a peak emission wavelength ($\lambda_{peak,L}$) in a wavelength region of greater than about 600 nm and less than about 750 nm, about 500 nm to about 600 nm, and greater than or equal to about 400 nm and less than about 500 nm, respectively.

The first, second, and third light emitting elements 210, 220, and 230 may be, for example, light emitting diodes, for example, organic light emitting diodes including an organic light emitting material.

The photosensor 300 may be formed on the substrate 110 (or thin film transistor substrate) and may be randomly or regularly arranged along the in-plane direction (e.g., xy direction) of the substrate 110. As described above, the photosensor 300 may be disposed in the non-display area NDA, and may be connected to a separate thin film transistor 120 to be independently driven. The photosensor 300 may be configured to absorb light belonging to a wavelength spectrum of light emitted from at least one of the first, second or third light emitting elements 210, 220, or 230 and convert the absorbed light into an electrical signal. For example, light of a red wavelength spectrum, a green wavelength spectrum, a blue wavelength spectrum, an infrared wavelength spectrum, or any combination thereof may be absorbed and converted into an electrical signal, and for example, light of a green wavelength spectrum may be absorbed and converted into an electrical signal.

The photosensor 300 may be, for example, a photoelectric conversion diode, for example an organic photoelectric conversion diode including an organic light absorbing material.

Each of the first, second, and third light emitting elements 210, 220, and 230 and the photosensor 300 may include a separate, respective pixel electrode of the first pixel electrodes 211, 221, and/or 231 or a second pixel electrode 310; a separate portion of a common electrode 320 facing the first and second pixel electrodes 211, 221, 231, and 310, respectively, to which a common voltage is applied; a separate, respective light emitting layer 212, 222, and 232 or a photosensitive layer 330 between the first and second pixel electrodes 211, 221, 231, and 310 and the common electrode 320; a separate portion of a first common auxiliary layer 350; and a separate portion of a second common auxiliary layer 340.

The first, second and third light emitting elements 210, 220, and 230 and the photosensor 300 are arranged at least partially in parallel along the surface direction (e.g., xy direction) of the substrate 110, and the common electrode 320, the first common auxiliary layer 350, and the second common auxiliary layer 340 formed on the whole surface of the substrate 110 may be shared. For example, as shown in at least FIG. 2, the photosensitive layer 330 of the photosensor 300 and the light emitting layers 212, 222, and 232 of the first, second, and third light emitting elements 210, 220, and 230 may at least partially overlap with each other (e.g., partially or completely overlap each other) in the in-plane direction (e.g., xy direction) of the substrate 110, which may be understood to be a horizontal direction that extends in parallel to an in-plane direction of the substrate 110 as shown in FIG. 2 and/or a horizontal direction that extends in parallel to an upper surface of the substrate 110 as shown in FIG. 2, and the photosensitive layer 330 and the light emitting layers 212, 222, and 232 may be at least partially positioned on the same plane (e.g., an xy plane extending in the xy directions that intersects each of the photoelectric conversion layer (i.e., photosensitive layer 330) and the light emitting layers 212, 222, and 232).

The common electrode 320 is continuously formed as a single piece of material that extends on the light emitting layers 212, 222, and 232 and the photosensitive layer 330, and is substantially formed on the whole surface of the substrate 110. The common electrode 320 may apply a common voltage to the first, second, and third light emitting elements 210, 220, and 230 and the photosensor 300. As shown, the first, second, and third light emitting elements 210, 220, and 230 and the photosensor 300 may include separate portions of a single common electrode 320 that is a single piece of material that extends on each of the respective light emitting layers 212, 222, and 232 and the photosensitive layer 330 and between the first, second, and third light emitting elements 210, 220, and 230 and the photosensor 300.

The common electrode 320 may be a light-transmitting electrode capable of transmitting light. The light-transmitting electrode may be a transparent electrode or a semi-transmissive electrode. The transparent electrode may have a light transmittance of about 85% to about 100%, about 90% to about 100%, or about 95% to about 100%, and the semi-transmissive electrode may have a light transmittance of greater than or equal to about 30% and less than about 85%, about 40% to about 80%, or about 40% to about 75%. The transparent electrode and the semi-transmissive electrode may include, for example, at least one of an oxide conductor, a carbon conductor, or a metal thin film. The oxide conductors may include, for example, one or more of indium tin oxide (ITO), indium zinc oxide (IZO), zinc tin oxide (ZTO), aluminum tin oxide (ATO), and aluminum zinc oxide (AZO), the carbon conductor may include one or more of graphene and carbon nanostructures, and the metal thin film may be a very thin film including aluminum (Al), magnesium (Mg), silver (Ag), gold (Au), magnesium-silver (Mg—Ag), magnesium-aluminum (Mg—Al), an alloy thereof, or any combination thereof.

The first common auxiliary layer 350 may be disposed under the light emitting layers 212, 222, and 232 and the photosensitive layer 330 on the substrate 110, and among them, between the light emitting layers 212, 222, and 232 and the photosensitive layer 330 and the first and second pixel electrodes 211, 221, 231, and 310. The first common auxiliary layer 350 may be continuously formed as a single piece of material that extends under the light emitting layers 212, 222, and 232 and the photosensitive layer 330, and on the first and second pixel electrodes 211, 221, 231, and 310. As shown, the first, second, and third light emitting elements 210, 220, and 230 and the photosensor 300 may include separate portions of a single first common auxiliary layer 350 that is a single piece of material that extends under each of the respective light emitting layers 212, 222, and 232 and the photosensitive layer 330 and between the first, second, and third light emitting elements 210, 220, and 230 and the photosensor 300.

The first common auxiliary layer 350 may be a charge auxiliary layer (e.g., a hole auxiliary layer) that facilitates injection and/or movement of charge carriers (e.g., holes) from the first and second pixel electrodes 211, 221, and 231 to the light emitting layers 212, 222, and 232. For example, the HOMO energy level of the first common auxiliary layer 350 may be between the HOMO energy level of the light emitting layers 212, 222, and 232 and the work function of the first pixel electrodes 211, 221, and 231. The work function of the first pixel electrodes 211, 221, and 231, the HOMO energy level of the first common auxiliary layer 350, and the HOMO energy level of the light emitting layers 212, 222, and 232 may increase sequentially. For example, the HOMO energy level of the first common auxiliary layer 350 may be about 5.0 eV to about 6.3 eV, and the energy bandgap of the first common auxiliary layer 350 may be about 2.8 eV to about 6.0 eV, but is not limited thereto.

The first common auxiliary layer 350 may include an organic material, an inorganic material, an organic-inorganic material, or any combination thereof satisfying the HOMO energy level, for example a phthalocyanine compound such as copper phthalocyanine; DNTPD (N,N'-diphenyl-N,N'-bis-[4-(phenyl-m-tolyl-amino)-phenyl]-biphenyl-4,4'-diamine), m-MTDATA (4,4',4"-[tris(3-methylphenyl)phenylamino]triphenylamine), TDATA (4,4'4"-tris(N,N-diphenylamino)triphenylamine), 2-TNATA (4,4',4"-tris{N-(2-naphthyl)-N-phenylamino}-triphenylamine), PEDOT/PSS (poly(3,4-ethylenedioxythiophene)/poly(4-styrenesulfonate)), PANI/DBSA (polyaniline/dodecylbenzenesulfonic acid), PANI/CSA (polyaniline/Camphor sulfonic acid), PANI/PSS (polyaniline/poly(4-styrenesulfonate)), NPB (N,N'-di(naphthalene-1-yl)-N,N'-diphenylbenzidine), polyetherketone including triphenylamine (TPAPEK), 4-isopropyl-4'-methyldiphenyliodonium[tetrakis(pentafluorophenyl)borate], HAT-CN (dipyrazino[2,3-f: 2',3'-h]quinoxaline-2,3,6,7,10,11-hexacarbonitrile), a carbazole-based derivative such as N-phenylcarbazole, polyvinylcarbazole, and the like, a fluorine-based derivative, TPD (N,N'-bis(3-methylphenyl)-N,N'-diphenyl-[1,1-biphenyl]-4,4'-diamine), a triphenylamine-based derivative such as TCTA (4,4',4"-tris(N-carbazolyl)triphenylamine), NPB (N,N'-di(naphthalene-1-yl)-N,N'-diphenylbenzidine), TAPC (4,4'-cyclohexylidene bis[N,N-bis(4-methylphenyl)benzenamine]), HMTPD (4,4'-bis[N,N'-(3-tolyl)amino]-3,3'-dimethylbiphenyl), mCP (1,3-bis(N-carbazolyl)benzene), or any combination thereof, but is not limited thereto. The first common auxiliary layer 350 may be one layer or two or more layers.

The second common auxiliary layer 340 is disposed on the light emitting layers 212, 222, and 232 and the photosensitive layer 330 on the substrate 110, and among them, it may be continuously formed as a single piece of material that extends on the light emitting layers 212, 222, and 232 and the photosensitive layer 330 and under the common electrode 320. As shown, the first, second, and third light emitting elements 210, 220, and 230 and the photosensor 300 may include separate portions of a single second common auxiliary layer 340 that is a single piece of material that extends on each of the respective light emitting layers 212, 222, and 232 and the photosensitive layer 330 and between the first, second, and third light emitting elements 210, 220, and 230 and the photosensor 300.

The second common auxiliary layer 340 may be a charge auxiliary layer (e.g., an electron auxiliary layer) that facilitates injection and/or movement of charge carriers (e.g., electrons) from the common electrode 320 to the light emitting layers 212, 222, and 232. For example, a LUMO energy level of the second common auxiliary layer 340 may be between a LUMO energy level of the light emitting layers 212, 222, and 232 and a work function of the common electrode 320. The work function of the common electrode 320, the LUMO energy level of the second common auxiliary layer 340, and the LUMO energy level of the light emitting layers 212, 222, and 232 may be sequentially shallow. For example, the LUMO energy level of the second common auxiliary layer 340 may be about 2.5 eV to about 4.3 eV and the energy bandgap of the second common auxiliary layer 340 may be about 2.8 eV to about 6.0 eV, but the present inventive concepts are not limited thereto.

The second common auxiliary layer 340 may include an organic material, an inorganic material, an organic-inorganic material, or any combination thereof satisfying the LUMO energy level, for example a halogenated metal such as LiF, NaCl, CsF, RbCl, and RbI; a lanthanides metal such as Yb; a metal oxide such as $Li_2O$ or BaO; Liq (lithium quinolate), Alq3 (tris(8-hydroxyquinolinato)aluminum), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, TPBi (1,3,5-tri(1-phenyl-1H-benzo[d]imidazol-2-yl)phenyl), BCP (2,9-dimethyl-4,7-diphenyl-1,10-phenanthroline), Bphen (4,7-diphenyl-1,10-phenanthroline), TAZ (3-(4-biphenylyl)-4-phenyl-5-tertbutylphenyl-1,2,4-triazole), NTAZ (4-(naphthalen-1-yl)-3,5-diphenyl-4H-1,2,4-triazole), tBu-PBD (2-(4-biphenylyl)-5-(4-tert-butylphenyl)-1,3,4-oxadiazole), BAlq (bis(2-methyl-8-quinolinolato-N1,O8)-(1,1'-biphenyl-4-olato)aluminum), $Bebq_2$ (beryllium bis(benzoquinolin-10-olate), ADN (9,10-di(naphthalene-2-yl) anthracene), BmPyPhB (1,3-bis[3,5-di(pyridin-3-yl)phenyl] benzene), or any combination thereof, but is not limited thereto. The second common auxiliary layer 340 may be one layer or two or more layers.

The first, second, and third light emitting elements 210, 220, and 230 and the photosensor 300 include first or second pixel electrodes 211, 221, 231, or 310 facing the common electrode 320. One of the first and second pixel electrodes 211, 221, 231, and 310 or the common electrode 320 is an anode and the other is a cathode.

For example, the first and second pixel electrodes 211, 221, 231, and 310 may be an anode, and the common electrode 320 may be a cathode. The first and second pixel electrodes 211, 221, 231, and 310 may be separated for each subpixel PX, respectively, and may be electrically connected to a separate thin film transistor 120 to be independently driven.

The first and second pixel electrodes 211, 221, 231, and 310 may each be a light-transmitting electrode (a transparent electrode or a semi-transmissive electrode) or a reflective electrode. The light-transmitting electrode is the same as described above. The reflective electrode may include a reflective layer having a light transmittance of less than or equal to about 5% and/or a reflectance of greater than or equal to about 80%, and the reflective layer may include an optically opaque material. The optically opaque material may include a metal, a metal nitride, or any combination thereof, for example silver (Ag), copper (Cu), aluminum (Al), gold (Au), titanium (Ti), chromium (Cr), nickel (Ni), an alloy thereof, a nitride thereof (e.g., TiN), or any combination thereof, but is not limited thereto. The reflective electrode may be formed of a reflective layer or may have a stacked structure of a reflective layer/transmissive layer or a transmissive layer/reflective layer/transmissive layer, and the reflective layer may be one layer or two or more layers.

For example, when the first and second pixel electrodes 211, 221, 231, and 310 are reflective electrodes and the common electrode 320 is a light-transmitting electrode, the sensor-embedded display panel 1000 may be a top emission type display panel configured to emit light away from the substrate 110. For example, when the first and second pixel electrodes 211, 221, 231, and 310 and the common electrode 320 are light-transmitting electrodes, respectively, sensor-embedded display panel 1000 may be a both side emission type display panel.

For example, the first and second pixel electrodes 211, 221, 231, and 310 may be reflective electrodes and the common electrode 320 may be a semi-transmissive electrode. In this case, the first, second, and third light emitting elements 210, 220, and 230 and the photosensor 300 may form each microcavity structure. In the microcavity structure, reflection may occur repeatedly between the reflective electrode and the semi-transmissive electrode separated by a particular (or, alternatively, predetermined) optical length (e.g., a distance between the semi-transmissive electrode and the reflective electrode) and light of a particular (or, alternatively, predetermined) wavelength spectrum may be enhanced to improve optical properties.

For example, among the light emitted from the light emitting layers 212, 222, and 232 of the first, second, and third light emitting elements 210, 220, and 230, light of a particular (or, alternatively, predetermined) wavelength spectrum may be repeatedly reflected between the semi-transmissive electrode and the reflective electrode and then may be modified. Among the modified light, light of a wavelength spectrum corresponding to a resonance wavelength of a microcavity may be enhanced to exhibit amplified light emission characteristics in a narrow wavelength region. Accordingly, the sensor-embedded display panel 1000 may express colors with high color purity.

For example, among the light incident on the photosensor 300, light of a particular (or, alternatively, predetermined) wavelength spectrum may be repeatedly reflected between the semi-transmissive electrode and the reflective electrode to be modified. Among the modified light, light having a wavelength spectrum corresponding to the resonance wavelength of a microcavity may be enhanced to exhibit photoelectric conversion characteristics amplified in a narrow wavelength region. Accordingly, the photosensor 300 may exhibit high photoelectric conversion characteristics in a narrow wavelength region.

Each of the first, second, and third light emitting elements 210, 220, and 230 includes light emitting layers 212, 222, and 232 between the first pixel electrodes 211, 221, and 231 and the common electrode 320. Each of the light emitting layer 212 included in the first light emitting element 210, the light emitting layer 222 included in the second light emitting element 220, and the light emitting layer 232 included in the third light emitting element 230 may be configured to emit light in the same or different wavelength spectra and may be configured to emit light in, for example a red wavelength spectrum, a green wavelength spectrum, a blue wavelength spectrum, an infrared wavelength spectrum, or any combination thereof.

For example, when the first light emitting element 210, the second light emitting element 220, and the third light emitting element 230 are a red light emitting elements, a green light emitting element, and a blue light emitting element, respectively, the light emitting layer 212 may be a red light emitting layer configured to emit light in a red wavelength spectrum, the light emitting layer 222 included in the second light emitting element 220 may be a green light emitting layer configured to emit light in a green wavelength spectrum, and the light emitting layer 232 included in the third light emitting element 230 may be a blue light emitting layer configured to emit light in a blue wavelength spectrum. Herein, the red wavelength spectrum, the green wavelength spectrum, and the blue wavelength spectrum may have a peak emission wavelength of greater than about 600 nm and less than about 750 nm, about 500 nm to about 600 nm, and greater than or equal to about 380 nm and less than about 500 nm.

For example, when at least one of the first light emitting element 210, the second light emitting element 220, or the third light emitting element 230 is a white light emitting element, the light emitting layer of the white light emitting element may be configured to emit light of a full visible light wavelength spectrum, for example, light in a wavelength spectrum of greater than or equal to about 380 nm and less than about 750 nm, about 400 nm to about 700 nm, or about 420 nm to about 700 nm.

The light emitting layers 212, 222, and 232 may include at least one host material and a fluorescent or phosphorescent dopant, and at least one of the host material and the fluorescent or phosphorescent dopant may be an organic light emitting material. The organic light emitting material may include, for example, a low molecular weight organic light emitting material, for example, a depositable organic light emitting material.

The organic light emitting material included in the light emitting layers 212, 222, and 232 is not particularly limited as long as it is an electroluminescent material capable of emitting light of a particular (or, alternatively, predetermined) wavelength spectrum, and may include perylene; rubrene; 4-(dicyanomethylene)-2-methyl-6-[p-(dimethylamino)styryl]-4H-pyran; coumarin or a derivative thereof; carbazole or a derivative thereof; TPBi (2,2',2"-(1,3,5-benzinetriyl)-tris(1-phenyl-1-H-benzimidazole); TBADN (2-t-butyl-9,10-di(naphth-2-yl)anthracene); AND (9,10-di(naphthalene-2-yl)anthracene); CBP (4,4'-bis(N-carbazolyl)-1,1'-biphenyl); TCTA (4,4',4"-tris(carbazol-9-yl)-triphenylamine); TPBi (1,3,5-tris(N-phenylbenzimidazol-2-yl)benzene); TBADN (3-tert-butyl-9,10-di(naphth-2-yl) anthracene); DSA (distyrylarylene); CDBP (4,4'-bis(N-carbazolyl)-1,1'-biphenyl); CDBP (4,4"-bis(9-carbazolyl)-2,2'-dimethylbiphenyl); MADN (2-Methyl-9,10-bis (naphthalen-2-yl)anthracene); TCP (1,3,5-tris(carbazol-9-yl)benzene); Alq3 (tris(8-hydroxyquinolino)lithium); an organometallic compound including Pt, Os, Ti, Zr, Hf, Eu, Tb, Tm, Rh, Ru, Re, Be, Mg, Al, Ca, Mn, Co, Cu, Zn, Ga, Ge, Pd, Ag and/or Au, a derivative thereof, or any combination thereof, but is not limited thereto.

The organic light emitting material included in the light emitting layers 212, 222, and 232 may be a depositable organic light emitting material that may be vaporized (sublimated) at a particular (or, alternatively, predetermined) temperature to be deposited, and may have a particular (or, alternatively, predetermined) sublimation temperature (Ts). Herein, the sublimation temperature may be a temperature at which a weight loss of about 10% compared to an initial weight occurs during thermogravimetric analysis (TGA) at a low pressure of about 10 Pa or less (e.g., about 0.01 Pa to about 10 Pa), and may be a deposition temperature during the process or a set temperature of a deposition chamber used in the process.

The sublimation temperature (Ts) of the organic light emitting material that may be included in the light emitting layers 212, 222, and 232 may be less than or equal to about 350° C., and within the above range, less than or equal to about 340° C., less than or equal to about 330° C., less than or equal to about 320° C., less than or equal to about 310° C., less than or equal to about 300° C., less than or equal to about 290° C., less than or equal to about 280° C., less than or equal to about 270° C., or less than or equal to about 250° C., about 100° C. to 350° C., about 100° C. to about 340° C., about 100° C. to about 330° C., about 100° C. to about 320° C., about 100° C. to about 310° C., about 100° C. to about 300° C., about 100° C. to about 290° C., about 100° C. to about 280° C., about 100° C. to about 270° C., about 100° C. to about 260° C., about 100° C. to about 250° C., about 150° C. to about 350° C., about 150° C. to about 340° C., about 150° C. to about 330° C., about 150° C. to about 320° C., about 150° C. to about 310° C., about 150° C. to about 300° C., about 150° C. to about 290° C., about 150° C. to about 280 about ° C., about 150° C. to about 270° C., about 150° C. to about 260° C., or about 150° C. to about 250° C. By having the organic light emitting material having a sublimation temperature in the above range, it may be effectively deposited without substantial decomposition and/or deterioration of the organic light emitting material.

The photosensor 300 includes a photosensitive layer 330 between the second pixel electrode 310 and the common electrode 320. The photosensitive layer 330 may be disposed to extend at least partially in parallel with the light emitting layers 212, 222, and 232 of the first, second, and third light emitting elements 210, 220, and 230 along the in-plane direction (e.g., xy direction) of the substrate 110. The photosensitive layer 330 and the light emitting layers 212, 222, and 232 may be on the same plane.

The photosensitive layer 330 may be a photoelectric conversion layer configured to absorb light of a particular (or, alternatively, predetermined) wavelength spectrum and convert the absorbed light into an electrical signal, and may be configured to absorb light emitted from at least one of the aforementioned first, second, or third light emitting elements 210, 220, and 230 and then reflected by the recognition target 40 and convert the absorbed light into an electrical signal. The photosensitive layer 330 may be configured to absorb light of a red wavelength spectrum, a green wavelength spectrum, a blue wavelength spectrum, an infrared wavelength spectrum, or any combination thereof.

For example, the photosensitive layer 330 may be configured to selectively absorb light of a green wavelength spectrum having a peak absorption wavelength ($\lambda_{peak,A}$) in a wavelength spectrum of about 500 nm to about 600 nm, and it may be configured to absorb light emitted from the green light emitting element among the first, second and third light emitting elements 210, 220, and 230 and then reflected by the recognition target 40. The peak absorption wavelength ($\lambda_{peak,A}$) of the photosensitive layer 330 may belong to about 510 nm to about 580 nm, about 520 nm to about 570 nm, about 520 nm to about 560 nm, or about 520 nm to about 550 nm within the above range.

The photosensitive layer 330 may be a single layer at least partially comprising a light absorbing semiconductor configured to absorb light of the wavelength spectrum and photoelectrically convert the absorbed light. The photosensitive layer 330 may be a single layer made of (e.g., formed of, entirely comprising, consisting of, etc.) a light absorbing semiconductor configured to absorb light of the wavelength spectrum and photoelectrically convert the absorbed light. The photosensitive layer 330 may be formed of a single continuous phase of the light absorbing semiconductor.

Accordingly, one surface of the photosensitive layer 330 may be in contact with the first common auxiliary layer 350, and the other surface of the photosensitive layer 330 may be in contact with the second common auxiliary layer 340. The light absorbing semiconductor may be independently included in the photosensitive layer 330 to exhibit the aforementioned photoelectric conversion characteristics alone.

In some example embodiments, where the photosensitive layer 330 is a single layer at least partially comprising one type of light absorbing semiconductor, it generally does not include any counterpart semiconductor required (e.g., configured) to form any pn junction with the light absorbing semiconductor. In some example embodiments, since the photosensitive layer 330 is a single layer that is made of (e.g., formed of, completely and/or entirely comprising, consisting of, etc.) one type of light absorbing semiconductor, it generally does not include any counterpart semiconductor required (e.g., configured) to form any pn junction with the light absorbing semiconductor. That is, for example, when the light absorbing semiconductor is a p-type semiconductor, the photosensitive layer 330 does not include any separate n-type semiconductor for forming any pn junction with the light absorbing semiconductor, and for example, when the light absorbing semiconductor is an n-type semiconductor, the photosensitive layer 330 does not include any separate p-type semiconductor for forming any pn junction with a light absorbing semiconductor.

Therefore, unlike a general photoelectric conversion layer including both a p-type semiconductor and an n-type semiconductor, the light absorbing semiconductor may require electrical characteristics to stably transmit holes and electrons generated by absorbing light to the second pixel electrode 310 and the common electrode 320, respectively. Accordingly, the first common auxiliary layer 350 and the second common auxiliary layer 340 adjacent to each other should be effectively electrically matched.

For example, when the second pixel electrode 310 is an anode and the common electrode 320 is a cathode, the light absorbing semiconductor has a HOMO energy level that effectively matches (e.g., is the same as or is within a certain margin of) the HOMO energy level of the first common auxiliary layer 350 and at the same time, the light absorbing semiconductor may have a LUMO energy level that effectively matches (e.g., is the same as or is within a certain margin of) the LUMO energy level of the second common auxiliary layer 340.

For example, a difference between the HOMO energy level of the light absorbing semiconductor and the HOMO energy level of the first common auxiliary layer 350 (a material constituting the first common auxiliary layer) may be less than about 1.0 eV (e.g., between about 0.0 eV and about 1.0 eV) and a difference between the LUMO energy level of the light absorbing semiconductor and the LUMO energy level of the second common auxiliary layer 340 (a material constituting the second common auxiliary layer) may be less than about 1.0 eV (e.g., between about 0.0 eV and about 1.0 eV).

For example, the difference between the HOMO energy level of the light absorbing semiconductor and the HOMO energy level of the first common auxiliary layer 350 may be about 0.0 eV to about 0.8 eV and the difference between the LUMO energy level of the light absorbing semiconductor and the LUMO energy level of the second common auxiliary layer 340 may be about 0.0 eV to about 0.8 eV.

For example, the difference between the HOMO energy level of the light absorbing semiconductor and the HOMO energy level of the first common auxiliary layer 350 may be about 0.0 eV to about 0.6 eV and the difference between the LUMO energy level of the light absorbing semiconductor and the LUMO energy level of the second common auxiliary layer 340 may be about 0.0 eV to about 0.6 eV.

For example, the difference between the HOMO energy level of the light absorbing semiconductor and the HOMO energy level of the first common auxiliary layer 350 may be about 0.0 eV to about 0.5 eV and the difference between the LUMO energy level of the light absorbing semiconductor and the LUMO energy level of the second common auxiliary layer 340 may be about 0.0 eV to about 0.5 eV.

For example, the energy bandgap of the light absorbing semiconductor may be narrower than each energy bandgap of the first common auxiliary layer 350 and the second common auxiliary layer 340 while satisfying the aforementioned ranges of the HOMO energy level and the LUMO energy level. For example, the energy bandgap of the light absorbing semiconductor may be less than about 3.0 eV, and may be about 1.0 eV to about 2.8 eV or about 1.2 eV to about 2.7 eV within the above range.

Meanwhile, the light absorbing semiconductor may be a depositable organic light absorbing material that can be vaporized (sublimated) and deposited at a particular (or, alternatively, predetermined) temperature while exhibiting effective photoelectric conversion characteristics alone as described above.

In some example embodiments, the photosensitive layer 330 may be entirely made of (e.g., may be formed of, may consist of, etc.) the light absorbing semiconductor and may not include any other materials, but example embodiments are not limited thereto. For example, in some example embodiments, the photosensitive layer 330 may include the light absorbing semiconductor and at least one additional material that is not a counterpart semiconductor configured to form a pn junction with the light absorbing semiconductor (e.g., an acrylic resin, a (meth)acrylic resin, polyisoprene, a vinyl resin, an epoxy resin, an urethane resin, a cellulose resin, a perylene resin, or any combination thereof, but example embodiments are not limited thereto), and the photosensitive layer 330 may not include any counterpart semiconductor configured to form any pn junction with the light absorbing semiconductor.

The organic light absorbing material may have a particular (or, alternatively, predetermined) sublimation temperature (Ts), and the sublimation temperature (Ts) of the organic light absorbing material may be less than or equal to about 300° C., and within the range, less than or equal to about 290° C., less than or equal to about 280° C., less than or equal to about 270° C., less than or equal to about 260° C., or less than or equal to about 250° C., about 100° C. to about 300° C., about 100° C. to about 290° C., about 100° C. to about 280° C., about 100° C. to about 270° C., about 100° C. to about 260° C., about 100° C. to about 250° C., about 150° C. to about 300° C., about 150° C. to about 290° C., about 150° C. to about 280° C., about 150° C. to about 270° C., about 150° C. to about 260° C., about 150° C. to about 250° C., about 200° C. to about 300° C., about 200° C. to about 290° C., about 200° C. to about 280° C., about 200° C. to about 270° C., about 200° C. to about 260° C., or about 200° C. to about 250° C.

The organic light absorbing material may have a particular (or, alternatively, predetermined) sublimation temperature (Ts) as described above, and thus may be vacuum deposited in the same chamber as the organic light emitting material of the above-described light emitting layers 212, 222, and 232. For example, a difference between the sublimation temperature of the organic light emitting material of the light emitting layers 212, 222, and 232 and the organic light absorbing material of the photosensitive layer 330 may be less than about 150° C., within the above range, for example less than or equal to about 140° C., less than or equal to about 130° C., less than or equal to about 120° C., less than or equal to about 110° C., less than or equal to about 100° C., less than or equal to about 90° C., less than or equal to about 80° C., less than or equal to about 70° C., less than or equal to about 60° C., less than or equal to about 50° C., less than or equal to about 40° C., less than or equal to about 30° C., less than or equal to about 20° C., less than or equal to about 15° C., or less than or equal to about 10° C., within the above range, greater than or equal to about 0° C. and less than about 150° C., about 0° C. to about 140° C., about 0° C. to about 130° C., about 0° C. to about 120° C., about 0° C. to about 110° C., about 0° C. to about 100° C., about 0° C. to about 90° C., about 0° C. to about 80° C., about 0° C. to about 70° C., about 0° C. to about 60° C., about 0° C. to about 50° C., about 0° C. to about 40° C., about 0° C. to about 30° C., about 0° C. to about 20° C., about 0° C. to about 15° C., about 0° C. to about 10° C., greater than or equal to about 2° C. and less than about 150° C., about 2° C. to about 140° C., about 2° C. to about 130° C., about 2° C. to about 120° C., about 2° C. to about 110° C., about 2° C. to about 100° C., about 2° C. to about 90° C., about 2° C. to about 80° C., 2° C. to about 70° C., about 2° C. to about 60° C., about 2° C. to about 50° C., about 2° C. to about 40° C., about 2° C. to about 30° C., about 2° C. to about 20° C., about 2° C. to about 15° C., or about 2° C. to about 10° C.

The organic light absorbing material may not only have the aforementioned photoelectric conversion characteristics and thermal properties but also have process stability that it can be stably deposited at a relatively high temperature at a relatively high deposition rate and in addition, have high heat resistance that it is not decomposed and/or deteriorated in a subsequent long-term high temperature process of the sensor-embedded display panel 1000. For example, the organic light absorbing material may be stably deposited at a relatively high process temperature (deposition temperature) of greater than or equal to about 320° C. at a relatively high deposition rate of greater than or equal to about 2 Å/s, for example, at a process temperature (deposition temperature) of about 320° C. to about 380° C. at a deposition rate of about 2 Å/s to about 7 Å/s.

In this way, the photosensitive layer 330 alone includes a light absorbing semiconductor (organic light absorbing material) that simultaneously satisfies the aforementioned photoelectric conversion characteristics and thermal characteristics, unlike a general photoelectric conversion layer including both a p-type semiconductor and an n-type semiconductor, and thereby it is possible to prevent the performance of the photosensitive layer 330 from being deteriorated, or reduce or minimize such deterioration, due to the different processability of the p-type semiconductor and the n-type semiconductor. As a result, the reliability of the photosensor 300 and thus the sensor-embedded display panel 1000 including same may be improved based on including the photosensitive layer 330 with the first and second common auxiliary layers 340 and 350 according to any of the example embodiments.

For example, a p-type semiconductor and an n-type semiconductor for a pn junction are selected from materials with good electrical matching, but due to the difference in deposition temperature (sublimation temperature) between the p-type semiconductor and the n-type semiconductor, the different optimal deposition rates for the p-type semiconductor and the n-type semiconductor, and instability caused by changes in the ratio of the p-type semiconductor and the n-type semiconductor, when the p-type semiconductor and the n-type semiconductor are simultaneously or sequentially formed, performance of the photosensitive layer 330 may be deteriorated.

Accordingly, in some example embodiments, the photosensitive layer 330 alone includes a light absorbing semiconductor having the aforementioned photoelectric conversion characteristics and thermal characteristics without mismatching of processability between the plurality of materials, and thus the performance deterioration of the photosensor 300 may be prevented (or reduced or minimized), thereby improving the reliability of the photosensor 300 and thus the sensor-embedded display panel 1000 including same, and at the same time, the performance of the sensor-embedded display panel 1000 may be improved by forming effective electrical matching with the first and second common auxiliary layers 350 and 340 shared with the first, second, and third light emitting elements 210, 220, and 230, thereby improving operational performance of the photosensor 300 and thus the sensor-embedded display panel 1000 including same.

For example, the light absorbing semiconductor may be an organic light absorbing material including an electron donating moiety and an electron accepting moiety, and optionally further include a π-conjugated linking moiety between the electron donating moiety and the electron accepting moiety.

The organic light absorbing material may be, for example, represented by Chemical Formula 1.

EDM-LM-EAM [Chemical Formula 1]

In Chemical Formula 1,

EDM may be an electron donating moiety,

EAM may be an electron accepting moiety, and the LM may be a pi conjugated linking moiety linking the electron donating moiety and the electron accepting moiety.

The organic light absorbing material may be, for example, represented by Chemical Formula 2.

[Chemical Formula 2]

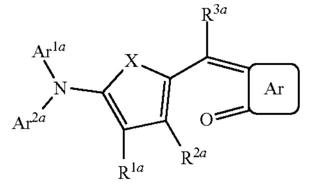

In Chemical Formula 2,

X may be O, S, Se, Te, SO, $SO_2$, $CR^bR^c$, or $SiR^dR^e$,

Ar may be a substituted or unsubstituted C6 to C30 arylene group, a substituted or unsubstituted C3 to C30 heterocyclic group, or fused rings thereof, $Ar^{1a}$ and $Ar^{2a}$ may each independently be a substituted or unsubstituted C6 to C30 aryl(ene) group or a substituted or unsubstituted C3 to C30 heteroaryl(ene) group, $R^{1a}$ to $R^{3a}$ and $R^b$ to $R^e$ may each independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or any combination thereof, and $Ar^{1a}$, $Ar^{2a}$, $R^{1a}$, and $R^{2a}$ may each independently be present, or two adjacent ones of $Ar^{1a}$, $Ar^{2a}$, $R^{1a}$, and $R^{2a}$ may be linked to each other to form a ring.

For example, $Ar^{1a}$ and $Ar^{2a}$ may each independently be one of a substituted or unsubstituted phenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyridazinyl group, a substituted or unsubstituted pyrimidinyl group, a substituted or unsubstituted pyrazinyl group, a substituted or unsubstituted quinolinyl group, a substituted or unsubstituted isoquinolinyl group, a substituted or unsubstituted naphthyridinyl group, a substituted or unsubstituted cinnolinyl group, a substituted or unsubstituted quinazolinyl group, a substituted or unsubstituted phthalazinyl group, a substituted or unsubstituted benzotriazinyl group, a substituted or unsubstituted pyridopyrazinyl group, a substituted or unsubstituted pyridopyrimidinyl group, or a substituted or unsubstituted pyridopyridazinyl group.

For example, $Ar^{1a}$ and $Ar^{2a}$ may be fused to each other to form a ring.

For example, $Ar^{2a}$ and $R^{1a}$ may be fused to each other to form a ring.

Specifically, the organic light absorbing material may be represented by Chemical Formula 2A or 2B.

[Chemical Formula 2A]

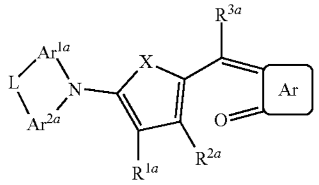

[Chemical Formula 2B]

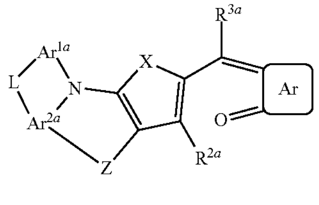

In Chemical Formulas 2A and 2B,

X may be O, S, Se, Te, SO, $SO_2$, $CR^bR^c$, or $SiR^dR^e$,

Ar may be a substituted or unsubstituted C6 to C30 arylene group, a substituted or unsubstituted C3 to C30 heterocyclic group, or fused rings thereof, $Ar^{1a}$ and $Ar^{2a}$ may each independently be a substituted or unsubstituted C6 to C30 arylene group or a substituted or unsubstituted C3 to C30 heteroarylene group, L and Z may each independently be a single bond, O, S, Se, Te, SO, $SO_2$, $CR^fR^g$, $SiR^hR^i$, $GeR^jR^k$, $NR^l$, a substituted or unsubstituted C1 to C30 alkylene group, a substituted or unsubstituted C3 to C30 cycloalkylene group, a substituted or unsubstituted C6 to C30 arylene group, or any combination thereof, and $R^{1a}$, $R^{2a}$, $R^{3a}$, and $R^b$ to $R^l$ may each independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or any combination thereof.

As described above, the light absorbing semiconductor of the photosensitive layer 330 alone may form effective electrical matching with the first and second common auxiliary layers 350 and 340, respectively. Since the organic light emitting material of the light emitting layers 212, 222, and 232 and the light absorbing semiconductor of the photosensitive layer 330 have similar thermal properties, the photosensor may be effectively formed in the display panel without deterioration of electrical characteristics and complexity of the process, thereby improving the reliability of the photosensor 300 and thus the sensor-embedded display panel 1000 including same and further reducing costs and/or complexity of a manufacturing process to manufacture the photosensor 300 and thus the sensor-embedded display panel 1000 including same.

A thickness of the light emitting layers 212, 222, 232 and the photosensitive layer 330 may each independently be about 5 nm to about 300 nm, and within the above range, about 10 nm to about 250 nm, about 20 nm to about 200 nm, or about 30 nm to about 180 nm. A difference between the thicknesses of the light emitting layers 212, 222, and 232 and the photosensitive layer 330 may be less than or equal to about 30 nm, and within the above range, less than or equal to about 25 nm, less than or equal to about 20 nm, less than or equal to about 15 nm, less than or equal to about 10 nm, or less than or equal to about 5 nm, and the light emitting layers 212, 222, and 232 may have substantially the same thickness as the photosensitive layer 330.

On the first, second and third light emitting elements 210, 220, and 230 and the photosensor 300, the encapsulation layer 50 is formed. The encapsulation layer 50 may include, for example, a glass plate, a metal thin film, an organic layer, an inorganic layer, an organic/inorganic layer, or any combination thereof. The organic layer may include, for example, an acrylic resin, a (meth)acrylic resin, polyisoprene, a vinyl resin, an epoxy resin, an urethane resin, a cellulose resin, a perylene resin, or any combination thereof, but is not limited thereto. The inorganic layer may include, for example, oxide, nitride, and/or oxynitride, for example, silicon oxide, silicon nitride, silicon oxynitride, aluminum oxide, aluminum nitride, aluminum oxynitride, zirconium oxide, zirconium nitride, zirconium oxynitride, titanium oxide, titanium nitride, titanium oxynitride, hafnium oxide, hafnium nitride, hafnium oxynitride, tantalum oxide, tantalum nitride, tantalum oxynitride, lithium fluoride, or any combination thereof, but is not limited thereto. The organic/inorganic layer may include, for example, polyorganosiloxane but is not limited thereto. The encapsulation layer 50 may have one layer or two or more layers.

As described above, the sensor-embedded display panel 1000 according to some example embodiments includes the first, second, and third light emitting elements 210, 220, and 230 configured to emit light in a particular (or, alternatively, predetermined) wavelength spectrum to display colors, and the photosensor 300 configured to absorb light emitted from the first, second, or third light emitting elements 210, 220, and 230 and then reflected by the recognition target 40 and convert the absorbed light into an electrical signal, in the same plane on the substrate 110, thereby performing a display function and a recognition function (e.g., biometric recognition function). Accordingly, unlike conventional display panels formed outside the display panel or formed under the display panel by manufacturing the sensor as a separate module, the photosensor 300 configured may exhibit improved light sensing (e.g., improved photoelectric conversion) performance without increasing the thickness of the photosensor 300, thereby implementing a slim-type high performance sensor-embedded display panel 1000 and enabling improved compactness and thus improved miniaturization of the sensor-embedded display panel 1000 without loss in image sensing performance and thus without loss in performance of functionality associated with such image sensing (e.g., biometric functionality).

In addition, since the photosensor 300 uses light emitted from the first, second, or third light emitting elements 210, 220, or 230, a recognition function (e.g., biometric recognition function) may be performed without a separate light source. Therefore, it is not necessary to provide a separate light source outside the display panel, thereby preventing a decrease in the aperture ratio of the display panel due to the area occupied by the light source, and at the same time saving power consumed by the separate light source to improve power consumption, thereby improving operational efficiency of the sensor-embedded display panel 1000 that includes the photosensor 300 together with one or more of the first, second, or third light emitting elements 210, 220, or 230.

In addition, since the photosensor 300 may be disposed anywhere in the non-display area NDA, a desired number (e.g., any desired quantity) of photosensors 300 may be disposed at one or more desired locations in the sensor-embedded display panel 1000. Therefore, for example, by randomly or regularly arranging photosensors 300 over the entire sensor-embedded display panel 1000, the biometric recognition function may be performed on any portion of the screen of an electronic device such as a mobile device or the biometric recognition function may be selectively performed only in a specific location where the biometric recognition function is required.

In addition, as described above, since the first, second and third light emitting elements 210, 220, and 230 and the photosensor 300 share the common electrode 320, the first common auxiliary layer 350, and the second common auxiliary layer 340, a structure and a process may be simplified, compared with the case of forming the first, second and third light emitting elements 210, 220, and 230 with the photosensor 300 through a separate process, thereby enabling the sensor-embedded display panel 1000 to be manufactured with reduced manufacturing costs and/or process complexity (which thereby reduces the likelihood of manufacturing process defects in the sensor-embedded display panel 1000 and thus improves the reliability of the manufactured sensor-embedded display panel 1000).

In addition, as described above, the organic light emitting material included in the light emitting layers 212, 222, and 232 of the first, second and third light emitting elements 210, 220, and 230 and the light absorbing semiconductor (organic light absorbing material) included in the photosensitive layer 330 of the photosensor 300 have a sublimation temperature within a particular (or, alternatively, predetermined) range and thus may be deposited through a continuous process in the same chamber. Accordingly, the first, second and third light emitting elements 210, 220, and 230 and the photosensor 300 are manufactured through one process, realizing a display panel conducting a display function and a recognition function (e.g., biometric recognition function) together without a substantially additional process thereby enabling the sensor-embedded display panel 1000 to be manufactured with reduced manufacturing costs and/or process complexity (which thereby reduces the likelihood of manufacturing process defects in the sensor-embedded display panel 1000 and thus improves the reliability of the manufactured sensor-embedded display panel 1000).

In addition, the photosensor 300 may be an organic sensor including an organic photosensitive layer, and thus may have twice or more as high light absorption as an inorganic diode such as a silicon photodiode and thus a high sensitivity sensing function even with a much thinner thickness and enabling improved compactness and thus improved miniaturization of the sensor-embedded display panel 1000 without loss of functionality of the sensor-embedded display panel 1000.

In addition, as described above, the photosensor 300 may be stably formed under optimal or improved process conditions by including the aforementioned light absorbing semiconductor alone in the photosensitive layer 330 thereof, and thus secure stability without deteriorating performance due to a processability difference of a plurality of materials (e.g., p-type semiconductor and n-type semiconductor).

Accordingly, the photosensor 300 may have sufficient light absorption characteristics, and thus high photoelectric conversion characteristics and accordingly, may be effectively applied to the sensor-embedded display panel 1000 with a large area.

Hereinafter, another example of the sensor-embedded display panel 1000 according to some example embodiments will be described.

Figure 3:
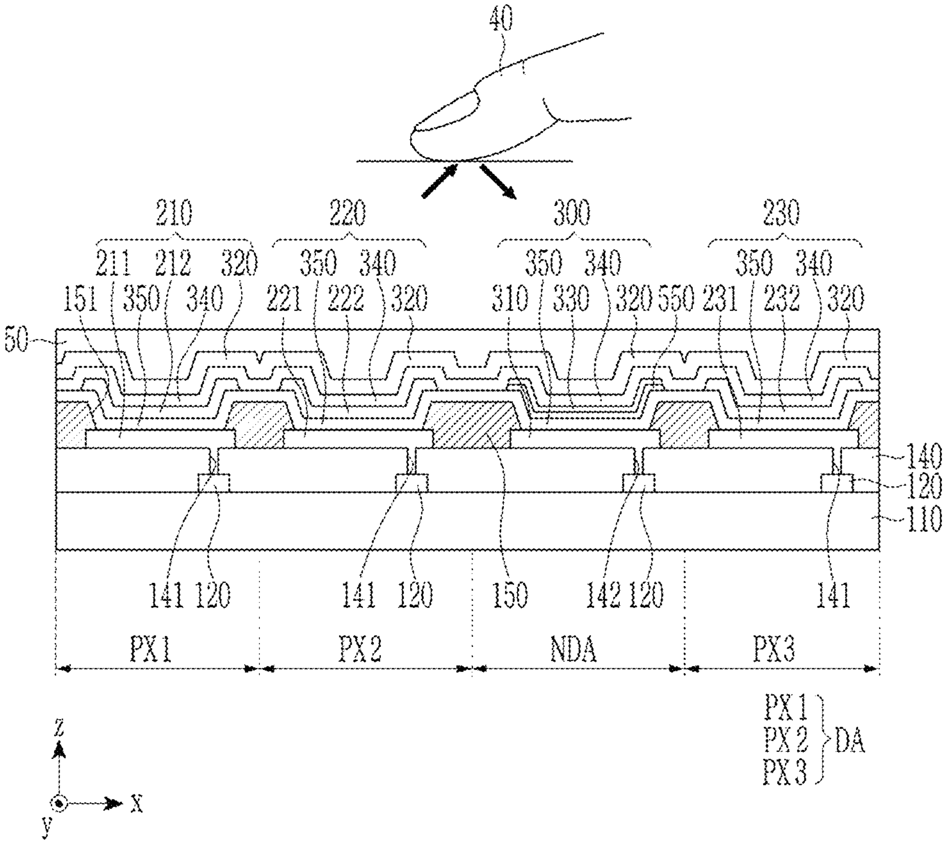
FIG. 3 is a cross-sectional view illustrating another example of a sensor-embedded display panel according to some example embodiments.

FIG. 3 is a cross-sectional view illustrating another example of a sensor-embedded display panel according to some example embodiments.

Referring to FIG. 3, the sensor-embedded display panel 1000 according to some example embodiments, like some example embodiments, including the example embodiments shown in FIG. 2, includes a display area DA configured to display a color and a non-display area NDA excluding the display area, wherein the display area DA includes a plurality of subpixels PX configured to display different colors one another, that is, a first subpixel PX1, a second subpixel PX2, and a third subpixel PX3 configured to display first, second, and third colors differing one another and selected from red, green, and blue, and the first subpixel PX1, the second subpixel PX2, and the third subpixel PX3 respectively include the first light emitting element 210, the second light emitting element 220, and the third light emitting element 230, and the photosensor 300 is disposed in the non-display area NDA.

However, the photosensor 300 of the sensor-embedded display panel 1000 according to some example embodiments, unlike some example embodiments, including the example embodiments shown in FIG. 2, further includes an optical auxiliary layer 550. The optical auxiliary layer 550 may be disposed between the photosensitive layer 330 and the first common auxiliary layer 350, for example, one surface of the optical auxiliary layer 550 may be in contact with the photosensitive layer 330, while the other (e.g., opposite) surface of the optical auxiliary layer 550 may be in contact with the first common auxiliary layer 350.

As described above, the second pixel electrode 310 may be a reflective electrode, and the common electrode 320 may be a semi-transmissive electrode, wherein the photosensor 300 may form a microcavity structure. In other words, when light emitted from one of the first, second, or third light emitting elements 210, 220, or 230 is reflected by the recognition target 40 and incident on the photosensor 300, light of a particular (or, alternatively, predetermined) wavelength spectrum out of the incident light on the photosensor 300 is modified through repeated reflection between the reflective electrode and the semi-transmissive electrode, and light corresponding to a resonance wavelength of the microcavity out of the modified light may be intensified and thus exhibit high photoelectric conversion characteristics in a narrow wavelength region. Herein, the resonance wavelength of the microcavity may correspond to a wavelength (e.g., sensing wavelength) exhibiting electrical characteristics of the photosensor 300 and may be determined by one of main factors, an optical length of the microcavity, which is a distance between the semi-transmissive electrode and the reflective electrode.

The optical auxiliary layer 550 is disposed between the photosensitive layer 330 and the first common auxiliary layer 350 to adjust the distance (the optical length) between the second pixel electrode 310 and the common electrode 320, for example, when the optical auxiliary layer 550 is thick, the optical length may be relatively longer, but when the optical auxiliary layer 550 is thin, the optical length may be relatively shorter. In other words, the photosensitive layer 330 may be configured to selectively absorb light of a first wavelength spectrum, one of a red wavelength spectrum, a green wavelength spectrum, a blue wavelength spectrum, an infrared wavelength spectrum, or any combination thereof, out of the incident light on the photosensor 300, and the optical auxiliary layer 550 may have a thickness at which the photosensor 300 exhibits resonance belonging to the first wavelength spectrum (e.g., a thickness which configures the photosensor 300 to have a resonance wavelength belonging to the first wavelength spectrum).

The thickness of the optical auxiliary layer 550 may be determined by a wavelength (e.g., sensing wavelength) at which the photosensor 300 exhibits electrical characteristics, for example, about 5 nm to about 200 nm and within the range, about 10 nm to about 150 nm or about 20 nm to about 100 nm. For example, a thickness of the optical auxiliary layer 550 may be thicker than that of the photosensitive layer 330, for example, about twice to about 20 times, about 3 times to about 15 times, or about 5 times to about 10 times thicker than that of the photosensitive layer 330, but is not limited thereto.

The photosensor 300 of the sensor-embedded display panel 1000 according to some example embodiments further includes the optical auxiliary layer 550 to compensate for the distance (optical length) between the second pixel electrode 310 and the common electrode 320, when the single photosensitive layer 330 is used, and thus may prevent deformation of the resonance wavelength and deterioration of optical properties of the photosensor 300.

Hereinafter, another example of the sensor-embedded display panel 1000 according to some example embodiments will be described.

Figure 4:
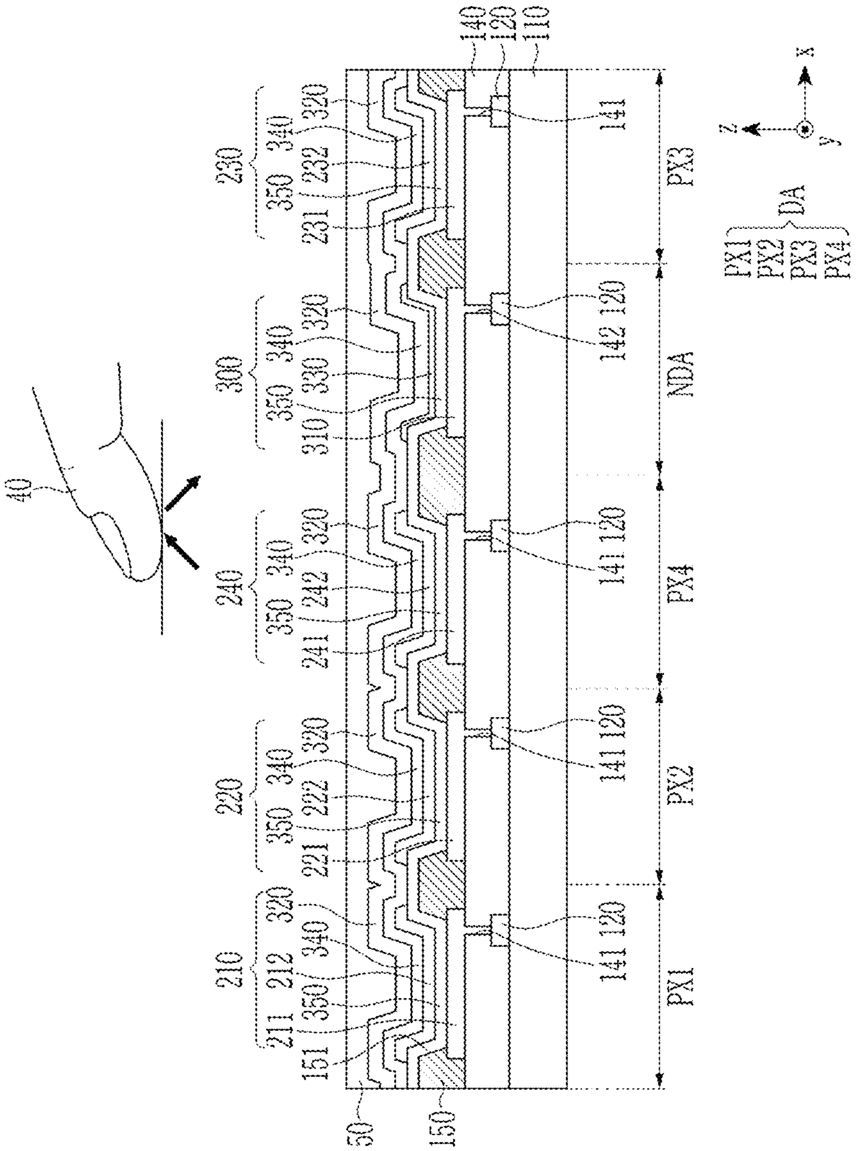
FIG. 4 is a cross-sectional view showing another example of a sensor-embedded display panel according to some example embodiments.

FIG. 4 is a cross-sectional view showing another example of a sensor-embedded display panel according to some example embodiments.

Referring to FIG. 4, the sensor-embedded display panel 1000 according to some example embodiments, like some example embodiments, including the example embodiments shown in FIG. 2, includes a display area DA configured to display a color and a non-display area NDA excluding the display area, wherein the display area DA includes a plurality of subpixels PX, that is, a first subpixel PX1, a second subpixel PX2, and a third subpixel PX3 configured to display a first color, a second color, and a third color differing one another and selected from red, green, and blue, and the first subpixel PX1, the second subpixel PX2, and the third subpixel PX3 each include the first light emitting element 210, the second light emitting element 220, and the third light emitting element 230, and the non-display area NDA includes the photosensor 300.

However, unlike some example embodiments, including the example embodiments shown in FIG. 2, the sensor-embedded display panel 1000 according to some example embodiments may further include the fourth light emitting element 240 configured to emit light in an infrared wavelength spectrum. For example, the fourth light emitting element 240 may be included in a fourth subpixel PX4 adjacent to the first subpixel PX1, the second subpixel PX2, and/or the third subpixel PX3, or may be included in a non-display area NDA. The fourth subpixel PX4 may form (e.g., at least partially define) one unit pixel UP together with the first subpixel PX1, the second subpixel PX2, and the third subpixel PX3, and the unit pixel UP may be arranged repeatedly along rows and/or columns.

Descriptions of the first subpixel PX1, the second subpixel PX2, the third subpixel PX3, the first light emitting element 210, the second light emitting element 220, the third light emitting element 230, and the photosensor 300 are the same as described above.

The fourth light emitting element 240 is disposed on the substrate 110 and may be disposed on the same plane as the first, second, and third light emitting elements 210, 220, and 230 and the photosensor 300. For example, as shown in at least FIG. 2, the photosensitive layer 330 of the photosensor 300 and the light emitting layers 212, 222, and 232 of the first, second, and third light emitting elements 210, 220, and 230 may at least partially overlap with each other (e.g., partially or completely overlap each other) in the in-plane direction (e.g., xy direction) of the substrate 110, which may be understood to be a horizontal direction that extends in parallel to an in-plane direction of the substrate 110 as shown in FIG. 2 and/or a horizontal direction that extends in parallel to an upper surface of the substrate 110 as shown in FIG. 2, and the photosensitive layer 330 and the light emitting layers 212, 222, and 232 may be at least partially positioned on the same plane (e.g., an xy plane extending in the xy directions that intersects each of the photosensitive layer 330 and the light emitting layers 212, 222, and 232). The fourth light emitting element 240 may be electrically connected to a separate thin film transistor 120 and driven independently. The fourth light emitting element 240 has a structure in which a third pixel electrode 241, a first common auxiliary layer 350, a light emitting layer 242, a second common auxiliary layer 340, and a common electrode 320 are sequentially stacked. Among them, the common electrode 320, the first common auxiliary layer 350, and the second common auxiliary layer 340 may be shared with the first, second, and third light emitting elements 210, 220, and 230 and the photosensor 300.

The light emitting layer 242 may be configured to emit light in an infrared wavelength spectrum, which may have for example a maximum emission wavelength in a range of greater than or equal to about 750 nm, about 750 nm to about 20 μm, about 780 nm to about 20 μm, about 800 nm to about 20 μm, about 750 nm to about 15 μm, about 780 nm to about 15 μm, about 800 nm to about 15 μm, about 750 nm to about 10 μm, about 780 nm to about 10 μm, about 800 nm to about 10 μm, about 750 nm to about 5 μm, about 780 nm to about 5 μm, about 800 nm to about 5 μm, about 750 nm to about 3 μm, about 780 nm to about 3 μm, about 800 nm to about 3 μm, about 750 nm to about 2 μm, about 780 nm to about 2 μm, about 800 nm to about 2 μm, about 750 nm to about 1.5 μm, about 780 nm to about 1.5 μm, or about 800 nm to about 1.5 μm.

The photosensor 300 may be configured to absorb light emitted from at least one of the first, second, third, or fourth light emitting elements 210, 220, 230, or 240 and then reflected by a recognition target 40 such as a living body or a tool, and then convert the absorbed light into an electrical signal. For example, the photosensor 300 may be configured to absorb light emitted from the fourth light emitting element 240 in an infrared wavelength spectrum and then reflected by the recognition target 40, and then convert the absorbed light into an electrical signal. In this case, the photosensitive layer 330 of the photosensor 300 may include a light absorbing semiconductor configured to selectively absorb and photoelectrically convert light of an infrared wavelength spectrum. As described above, the light absorbing semiconductor may be included alone in the photosensitive layer 330, and for example, it may be selected from light absorbing semiconductors having the aforementioned electrical and thermal characteristics while having an optical characteristic of selectively absorbing light of an infrared wavelength spectrum.

The sensor-embedded display panel 1000 according to some example embodiments includes the fourth light emitting element 240 configured to emit light in the infrared wavelength spectrum and the photosensor 300 configured to absorb light in the infrared wavelength spectrum. Therefore, in addition to the biometric detection function, the sensitivity of the photosensor 300 may be improved even in a low-illumination environment, and the detection capability of a three-dimensional image may be further increased by widening a dynamic range for detailed division of black and white contrast. Accordingly, the sensing capability of the sensor-embedded display panel 1000 may be further improved. In particular, since light in the infrared wavelength spectrum may have a deeper penetration depth due to its long wavelength characteristics and information located at different distances may be effectively obtained, images or changes in blood vessels such as veins, iris and/or face, etc., in addition to fingerprints may be effectively detected, and the scope of application may be further expanded.

In some example embodiments, the photosensor 300 may be provided separately from (e.g., independently of) a sensor-embedded display panel 1000 and/or from any light emitting elements, for example as a separate component of an electronic device. For example, an electronic device, such as the electronic device 2000 shown in FIG. 5 and/or FIG. 6, may include a plurality of photosensors 300, as a separate at least one additional device 1340, to serve as a camera for the electronic device separately from any light emitting elements and/or display panels of the electronic device 2000.

The aforementioned sensor-embedded display panel 1000 may be applied to (e.g., included in) electronic devices such as various display devices. Electronic devices such as display devices may be applied to, for example, mobile phones, video phones, smart phones, mobile phones, smart pads, smart watches, digital cameras, tablet PCs, laptop PCs, notebook computers, computer monitors, wearable computers, televisions, digital broadcasting terminals, e-books, personal digital assistants (PDAs), portable multimedia player (PMP), enterprise digital assistant (EDA), head mounted display (HMD), vehicle navigation, Internet of Things (IoT), Internet of all things (IoE), drones, door locks, safes, automatic teller machines (ATM), security devices, medical devices, or automotive electronic components, but are not limited thereto.

Figure 5:
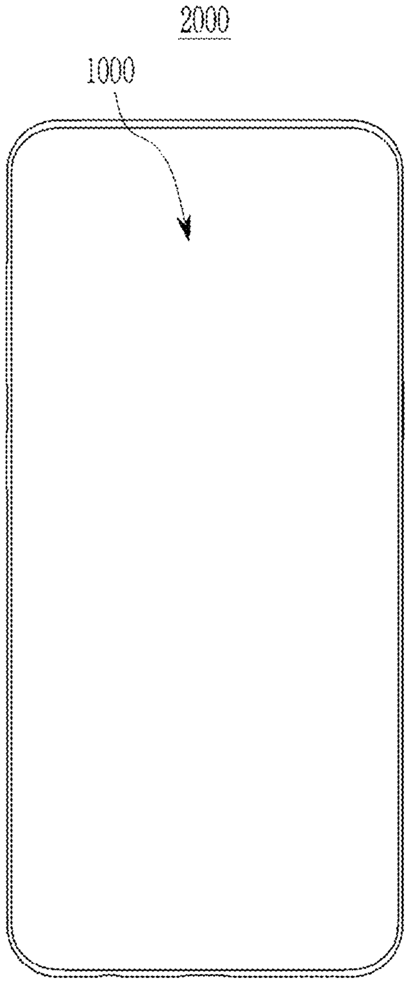
FIG. 5 is a schematic view illustrating an example of a smart phone as an electronic device according to some example embodiments.

FIG. 5 is a schematic view illustrating an example of a smart phone as an electronic device according to some example embodiments.

Referring to FIG. 5, the electronic device 2000 according to some example embodiments may include the aforementioned sensor-embedded display panel 1000, the sensor-embedded display panel 1000 having the photosensor 300 on the whole or a part of the area of the sensor-embedded display panel 1000, and thus a biometric recognition function may be performed on any part of the screen, and according to the user's selection, the biometric recognition function may be selectively performed only at a specific location where the biometric recognition function is required.

An example of a method of recognizing the recognition target 40 in an electronic device 2000 such as a display device may include, for example, driving the first, second, and third light emitting elements 210, 220, and 230 of the sensor-embedded display panel 1000 (or the first, second, third, and fourth light emitting elements 210, 220, 230, and 240) and the photosensor 300 to detect the light reflected from the recognition target 40 among the light emitted from the first, second, and third light emitting elements 210, 220, and 230 (or the first, second, third and fourth light emitting elements 210, 220, 230, and 240), in the photosensor 300; comparing the image of the recognition target 40 stored in advance with the image of the recognition target 40 detected by the photosensor 300; and judging the consistency of the compared images and if they match according to the determination that recognition of the recognition target 40 is complete, turning off the photosensor 300, permitting user's access to the display device, and driving the sensor-embedded display panel 1000 to display an image.

Figure 6:
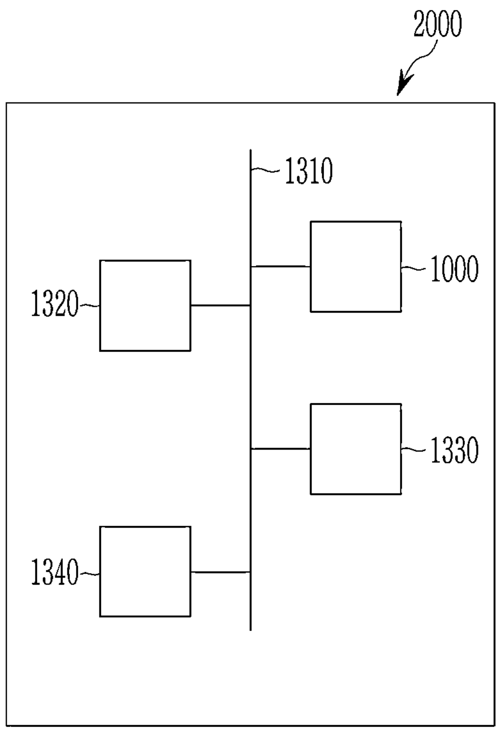
FIG. 6 is a schematic view illustrating an example of a configuration diagram of an electronic device according to some example embodiments.

FIG. 6 is a schematic view illustrating an example of a configuration diagram of an electronic device according to some example embodiments.

Referring to FIG. 6, in addition to the aforementioned constituent elements (e.g., the sensor-embedded display panel 1000), the electronic device 2000 may further include a bus 1310, a processor 1320, a memory 1330, and at least one additional device 1340. Information of the aforementioned sensor-embedded display panel 1000, processor 1320, memory 1330, and at least one additional device 1340 may be transmitted to each other through the bus 1310.

The processor 1320 may include one or more articles (e.g., units, instances, etc.) of processing circuitry such as a hardware including logic circuits; a hardware/software combination such as processor-implemented software; or any combination thereof. For example, the processing circuitry may be a central processing unit (CPU), an arithmetic logic unit (ALU), a digital signal processor, a microcomputer, a field programmable gate array (FPGA), System-on-Chip (SoC), a programmable logic unit, a microprocessor, an application-specific integrated circuit (ASIC), and the like. As an example, the processing circuitry may include a non-transitory computer readable storage device. The processor 1320 may control, for example, a display operation of the sensor-embedded display panel 1000 or a sensor operation of the photosensor 300.

The memory 1330 may be a non-transitory computer readable storage medium, such as, for example, as a solid state drive (SSD) and may store an instruction program (e.g., program of instructions), and the processor 1320 may perform a function related to the sensor-embedded display panel 1000 by executing the stored instruction program.

The at least one additional device 1340 may be one or more communication interfaces (e.g., wireless communication interfaces, wired interfaces), user interfaces (e.g., keyboard, mouse, buttons, etc.), power supply and/or power supply interfaces, or any combination thereof.

The units and/or modules described herein may be implemented using hardware constituent elements and software constituent elements. The units and/or modules described herein may include, may be included in, and/or may be implemented by one or more articles of processing circuitry such as a hardware including logic circuits; a hardware/software combination such as processor-implemented software; or any combination thereof. For example, the processing circuitry may be a central processing unit (CPU), an arithmetic logic unit (ALU), a digital signal processor, a microcomputer, a field programmable gate array (FPGA), System-on-Chip (SoC), a programmable logic unit, a microprocessor, an application-specific integrated circuit (ASIC), and the like. For example, the hardware constituent elements may include microphones, amplifiers, band pass filters, audio-to-digital converters, and processing devices. The processing device may be implemented using one or more hardware devices configured to perform and/or execute program code by performing arithmetic, logic, and input/output operations. The processing device may include a processor, a controller and an arithmetic logic unit, a digital signal processor, a microcomputer, a field programmable array, a programmable logic unit, a microprocessor, or any other device capable of responding to and executing instructions. The processing device may access, store, operate, process, and generate data in response to execution of an operating system (OS) and one or more software running on the operating system.

The software may include a computer program, a code, an instruction, or any combination thereof, and may transform a processing device for a special purpose by instructing and/or configuring the processing device independently or collectively to operate as desired. The software and data may be implemented permanently or temporarily as signal waves capable of providing or interpreting instructions or data to machines, parts, physical or virtual equipment, computer storage media or devices, or processing devices. The software may also be distributed over networked computer systems so that the software may be stored and executed in a distributed manner. The software and data may be stored by one or more non-transitory computer readable storage devices.

The method according to any of the example embodiments may be recorded in a non-transitory computer readable storage device including program instructions for implementing various operations of any of the example embodiments. The storage device may also include program instructions, data files, data structures, and the like alone or in combination. The program instructions recorded in the storage device may be specially designed for some example embodiments or may be known to those skilled in computer software and available for use. Examples of non-transitory computer-readable storage devices may include magnetic media such as hard disks, floppy disks, and magnetic tapes; optical media such as CD-ROM discs, DVDs and/or blue-ray discs; magneto-optical media such as optical disks; and a hardware device configured to store and execute program instructions such as ROM, RAM, flash memory, and the like. The aforementioned device may be configured to operate as one or more software modules to perform the operations of any of the example embodiments.

Hereinafter, some example embodiments are illustrated in more detail with reference to examples. However, the scope of the inventive concepts is not limited to the examples.

SYNTHESIS EXAMPLES

Synthesis Example 1

[Compound A]

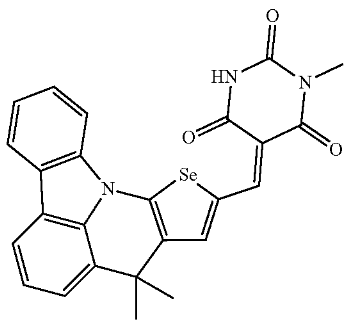

[Reaction Scheme A]

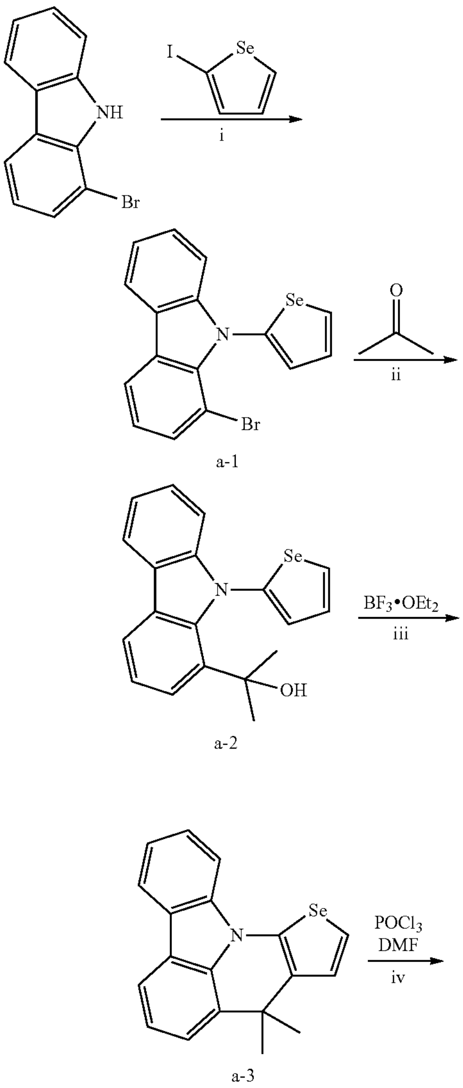

-continued

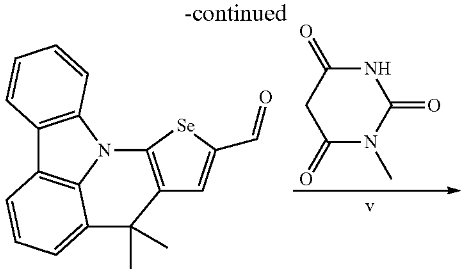

a-4

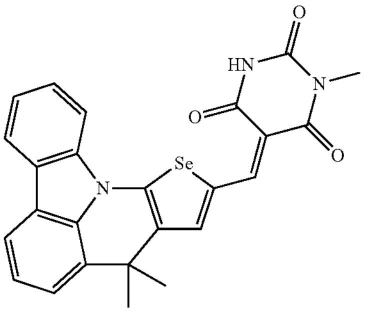

A (i) Synthesis of Compound a-1

9.4 g (36.5 mmol) of 2-iodoselenophene and 7.5 g (30.5 mmol) of 1-bromo-9H-carbazole are dissolved in 30 ml of dioxane. Subsequently, 0.29 g (1.52 mmol) of copper(I) iodide, 0.70 g (6.09 mmol) of trans-1,2-cyclohexanediamine, and 12.9 g (61.0 mmol) of tripotassium phosphate are added thereto and then, heated under reflux for 30 hours. Herein, the obtained product is separated and purified through silica gel column chromatography (hexane:ethyl acetate=5:1 in a volume ratio) to obtain 8.18 g (Yield: 72%) of Compound a-1.

(ii) Synthesis of Compound a-2

12.0 g (32.0 mmol) of Compound a-1 is dissolved in 300 ml of dehydrated diethyl ether. Subsequently, 12 ml (32.0 mmol) of a 2.76 M n-BuLi hexane solution is added dropwise thereto at −50° C. and then, stirred at room temperature for 1 hour. Subsequently, 2.0 g (35.2 mmol) of dehydrated acetone (dimethylketone, $CH_3COCH_3$) is added to the solution at −50° C. and then, stirred at room temperature for 2 hours.

An organic layer extracted in the diethyl ether is washed with a sodium chloride aqueous solution and dried with anhydrous magnesium sulfate. Herein, the obtained product is separated and purified through silica gel column chromatography (while changing volume ratio of hexane:dichloromethane=100:0 to 50:50) to obtain 6.3 g (Yield: 56%) of Compound a-2.

(iii) Synthesis of Compound a-3

6.23 g (17.6 mmol) of Compound a-2 is dissolved in 180 ml of dichloromethane. Subsequently, 4.98 g (35.5 mmol) of a boron trifluoride-ethyl ether complex is added dropwise to the solution at 0° C. and then, stirred for 2 hours. Subsequently, an organic layer extracted from the dichloromethane is washed with a sodium chloride aqueous solution and dried with anhydrous magnesium sulfate. Herein, the obtained product is separated and purified through silica gel column chromatography (hexane:dichloromethane=50:50 in a volume ratio) to obtain 5.12 g (Yield: 87%) of Compound a-3.

(iv) Synthesis of Compound a-4

1.9 ml (20.2 mmol) of phosphoryl chloride is added dropwise to 6.0 ml (77.5 mmol) of N,N-dimethyl formamide phosphoryl chloride at −15° C. and then, stirred at room temperature for 2 hours. This solution is slowly dripped to 150 ml of a dichloromethane solution in which 5.23 g (15.5 mmol) of Compound a-3 is dissolved at −15° C. and then, concentrated under a low pressure, while stirred at room temperature for 30 hours. Then, water is added thereto, and a sodium hydroxide aqueous solution is added thereto until pH becomes 14, and then, stirred at room temperature for 2 hours. An organic layer extracted with the dichloromethane is washed with a sodium chloride aqueous solution and then, dried with anhydrous magnesium sulfate. A product obtained therefrom is separated and purified through silica gel column chromatography (hexane:dichloromethane=50:50 in a volume ratio) to obtain 3.34 g (Yield: 65%) of Compound a-4.

(v) Synthesis of Compound A 2.00 g (5.55 mmol) of Compound a-4 is suspended in ethanol, and 1.05 g (6.66 mmol) of 1-methyl-2-thioxodihydropyrimidine-4,6(1H,5H)-dione is added thereto and then, reacted at 50° C. for 24 hours to obtain 2.4 g (Yield: 86%) of Compound A. The obtained compound is purified through sublimation up to 99.9%.

1H-NMR (500 MHz, DMSO-d6): δ 11.4 (s, 1H), 8.78 (s, 1H) 8.63 (s, 1H), 8.28 (d, 1H), 8.04 (d, 1H), 7.85 (d, 1H), 7.75 (m, 1H), 7.64 (d, 1H), 7.76 (dd, 2H), 3.21 (s, 3H), 1.71 (s, 6H).

Synthesis Example 2

[Compound B]

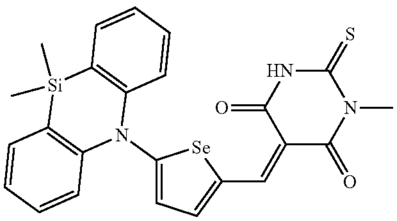

[Reaction Scheme B]

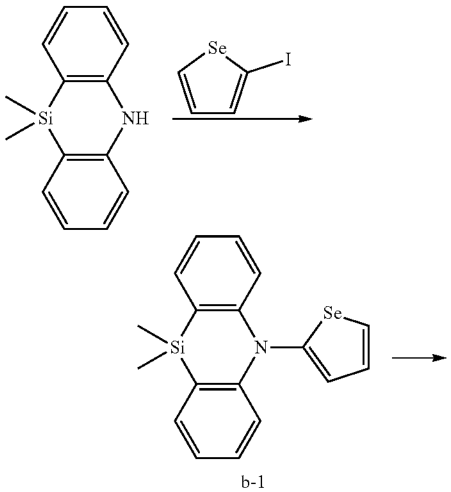

b-1

-continued

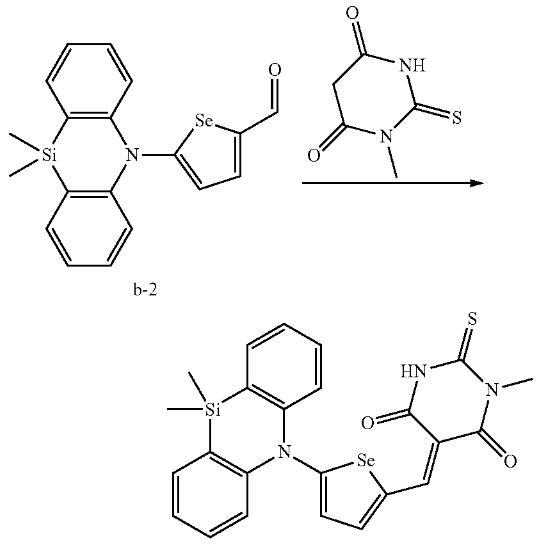

b-2

B (i) Synthesis of Compound b-1

7.01 g (27.3 mmol) of 2-iodoselenophene and 5.59 g (24.8 mmol) of diphenylamine are dissolved in 150 ml of anhydrous toluene and then, heated under reflux for 2 hours under the presence of 5 mol % of $Pd(dba)_2$, 5 mol % of $P(t\text{-}Bu)_3$, and 7.15 g (74.4 mmol) of NaOtBu. The obtained product is separated and purified through silica gel column chromatography (toluene:hexane=1:4 in a volume ratio) to obtain 8.0 g (Yield: 80%) of Compound b-1 (10,10-dimethyl-5-(selenophen-2-yl)-5,10-dihydrodibenzo[b,e][1,4]azasiline).

(ii) Synthesis of Compound b-2

1.11 ml of phosphoryl chloride is added dropwise to 3.19 ml of N,N-dimethylformamide at −15° C. and then, stirred at room temperature (24° C.) for 2 hours. The resultant is slowly added dropwise to a mixture of 200 ml of dichloromethane and 3.19 g of Compound b-1 at −15° C. and then, stirred at room temperature (24° C.) for 30 minutes and concentrated under a reduced pressure. Subsequently, 100 ml of water is added thereto, and a sodium hydroxide aqueous solution is added thereto until pH becomes 14 and then, stirred at room temperature (24° C.) for 2 hours. An organic layer extracted in the dichloromethane is washed with a sodium chloride aqueous solution and then, dried with anhydrous magnesium sulfate. The obtained product is separated and purified through silica gel column chromatography (hexane:ethylacetate=4:1 in a volume ratio) to obtain 2.20 g (Yield: 73%) of Compound b-2 (5-(10,10-dimethyldibenzo[b,e][1,4]azasilin-5(10H)-yl)selenoophene-2-carbaldehyde).

(iii) Synthesis of Compound B 1.77 g (4.64 mmol) of Compound b-2 is suspended in ethanol, and 0.89 g (5.57 mmol) of 1-methyl-2-thioxodihydropyrimidine-4,6(1H,5H)-dione is added thereto and then, reacted at 50° C. for 2 hours to obtain 2.0 g (Yield: 83%) of Compound B. The obtained compound is purified through sublimation up to 99.9%.

1H-NMR (500 MHz, DMSO-d6): δ12.1 (d, 1H), 8.29 (d, 1H), 8.22 (dd, 1H), 7.89 (dd, 2H) 7.76 (d, 2H), 7.61 (q, 2H), 7.48 (q, 2H), 6.59 (t, 1H), 3.48 (d, 3H), 0.41 (s, 6H).

Synthesis Example 3

[Compound C]

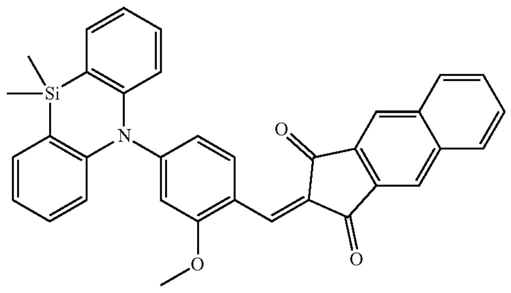

Compound C is synthesized in the same manner as in Synthesis Example 2 except that 1-iodo-3-methoxybenzene is used instead of the 2-iodoselenophene, and 1H-cyclopenta[b]naphthalene-1,3(2H)-dione is used instead of the 1-methyl-2-thioxodihydropyrimidine-4,6(1H,5H)-dione.

1H NMR (500 MHz, methylene chloride-d2) δ 9.36 (d, 1H), 8.48 (s, 1H), 8.42 (s, 2H), 8.13 (m, 2H), 7.71 (m, 4H), 7.47 (t, 2H), 7.42 (d, 2H), 7.32 (t, 2H), 6.76 (dd, 1H), 6.56 (d, 1H), 3.81 (s, 3H), 0.44 (s, 6H)

Synthesis Example 4

[Compound D]

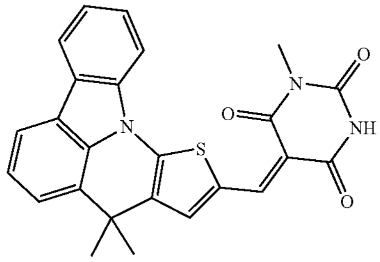

Compound D is synthesized in the same manner as in Synthesis Example 1 except that 2-iodothiophene is used instead of the 2-iodoselenophene.

1H-NMR (500 MHz, DMSO-d6): δ 11.1 (s, 1H), 8.55 (d, 1H) 8.09 (d, 1H), 8.01 (s, 1H), 7.94 (d, 1H), 7.52 (s, 1H), 7.45 (d, 1H), 7.35 (t, 1H), 7.11 (m, 2H), 3.61 (s, 3H), 1.69 (s, 6H).

Synthesis Example 5

[Compound E]

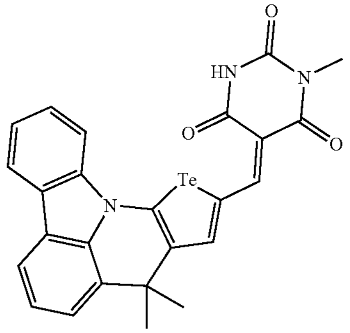

Compound E is synthesized in the same manner as in Synthesis Example 1 except that 2-iodotellurophene is used instead of the 2-iodoselenophene.

1H-NMR (500 MHz, DMSO-d6): δ 11.1 (s, 1H), 8.55 (d, 1H) 8.19 (d, 1H), 8.11 (d, 1H), 7.87 (s, 1H), 7.71 (d, 1H), 7.36 (t, 1H), 7.12 (m, 2H), 6.70 (s, 1H), 3.62 (s, 3H), 1.46 (s, 6H).

Reference Synthesis Example 1

[Compound X]

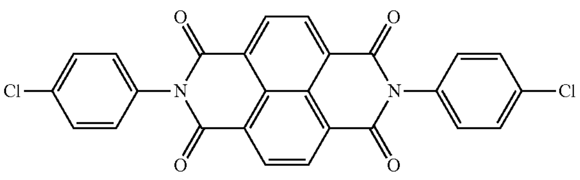

A mixture of 1,4,5,8-naphthalenetetracarboxylic dianhydride (1 eq.) and 4-chloroaniline (2.2 eq.) is dissolved in a dimethyl formamide (DMF) solvent and then, put in a two-necked and round-bottomed flask and stirred at 180° C. for 24 hours. Subsequently, after cooled to room temperature, methanol is added thereto to precipitate a product, which is filtered to obtain a powder-type material. Subsequently, the material is several times washed with methanol and purified through recrystallization with ethyl acetate and dimethylsulfoxide (DMSO). The obtained product is put in an oven and dried at 80° C. under vacuum for 24 hours to obtain Compound X. A yield thereof is 50% or more.

1H NMR (300 MHz, $CDCl_3$ with hexafluoroisopropanol): δ=8.85 (s, 4H), 7.63 (s, 4H), 7.60 (s, 4H).

Reference Synthesis Example 2

[Compound Y]

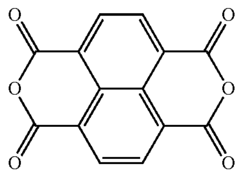

Compound Y (manufactured by Tokyo Chemical Industry) is prepared by sublimation purification.

Evaluation I

The compounds obtained in Synthesis Examples are respectively deposited on a glass substrate, and the deposited thin films are evaluated with respect to energy levels.

A HOMO energy level is evaluated by irradiating UV light to the thin films with AC-2 (Hitachi) or AC-3 (Riken Keiki Co., Ltd.) and measuring an amount of photoelectrons emitted according to energy. A LUMO energy level may be calculated by obtaining a bandgap energy with a UV-Vis spectrometer (Shimadzu Corporation) and then, using the bandgap energy and the HOMO energy level.

The results are shown in Table 1.

TABLE 1

| Synthesis Example Nos. | HOMO (eV) | LUMO (eV) | Energy bandgap (eV) |
|---|---|---|---|
| 1 | 5.60 | 3.52 | 2.08 |
| 2 | 5.48 | 3.35 | 2.13 |
| 3 | 5.76 | 3.56 | 2.20 |
| 4 | 5.65 | 3.49 | 2.16 |

Evaluation II

Sublimation temperatures of the compounds according to Synthesis Examples are evaluated.

The sublimation temperature is evaluated through a thermogravimetric analysis (TGA) by increasing a temperature under a high vacuum (10 Pa or less) to measure a temperature at which a weight of a sample decreases by 10% from the initial weight.

The results are shown in Table 2.

TABLE 2

| Synthesis Example Nos. | $T_{s\ (10)}$ (° C.) |
|---|---|
| 1 | 253 |
| 2 | 241 |
| 3 | 241 |
| 4 | 259 |

$T_{s\ (10)}$ (° C.): A temperature at which a weight of a sample decreases by 10% compared to its initial weight (sublimation temperature)

EXAMPLES: MANUFACTURE OF PHOTOSENSORS

Example 1

Al (10 nm), ITO (100 nm), and Al (8 nm) are sequentially deposited on a glass substrate to form a lower electrode with an Al/ITO/Al structure (work function: 4.9 eV). Subsequently, on the lower electrode, N,N'-bis(3-methylphenyl)-N,N'-diphenyl-[1,1-biphenyl]-4,4'-diamine is deposited to form a hole auxiliary layer (HOMO: 5.30 to 5.70 eV, LUMO: 2.00 to 2.30 eV). On the hole auxiliary layer, a 75 nm-thick optical auxiliary layer is formed, and then Compound A obtained in Synthesis Example 1 alone is deposited at 3 Å/s to form a 10 nm-thick single photosensitive layer. Subsequently, on the single photosensitive layer, 4,7-diphenyl-1,10-phenanthroline is deposited, forming an electron auxiliary layer (HOMO: 6.10 to 6.40 eV, LUMO: 2.90 to 3.20 eV). On the electron auxiliary layer, magnesium and silver are deposited to form an Mg:Ag upper electrode, manufacturing a photosensor.

Reference Example 1-1

A photosensor is manufactured in the same manner as in Example 1 except that a 60 nm-thick optical auxiliary layer is formed instead of the 75 nm-thick optical auxiliary layer, a 10 nm-thick P-type photosensitive layer is formed instead of the single photosensitive layer by depositing Compound A of Synthesis Example 1 at 3 Å/s, and a 40 nm-thick N-type photosensitive layer is additionally formed thereon by depositing Compound X of Reference Synthesis Example 1 at 10 Å/s.

Reference Example 1-2

A photosensor is manufactured in the same manner as in Example 1 except that a 60 nm-thick optical auxiliary layer is formed instead of the 75 nm-thick optical auxiliary layer, a 10 nm-thick P-type photosensitive layer is formed instead of the single photosensitive layer by depositing Compound A of Synthesis Example 1 at 3 Å/s, and a 20 nm-thick N-type photosensitive layer is additionally formed thereon by depositing Compound Y of Reference Synthesis Example 2 at 10 Å/s.

Example 2

A photosensor is manufactured in the same manner as in Example 1 except that Compound B of Synthesis Example 2 is deposited at 3 Å/s to form an 8 nm-thick single photosensitive layer instead of forming the 10 nm-thick single photosensitive layer by depositing Compound A of Synthesis Example 1 at 3 Å/s.

Example 3

A photosensor is manufactured in the same manner as in Example 1 except that Compound D of Synthesis Example 4 is deposited at 3 Å/s to form a 10 nm-thick single photosensitive layer instead of forming the 10 nm-thick single photosensitive layer by depositing Compound A of Synthesis Example 1 at 3 Å/s.

Evaluation III

Light absorption characteristics and electrical characteristics of the photosensors according to Examples 1 to 3 and Reference Examples 1-1 and 1-2 are evaluated.

The light absorption characteristics are evaluated from peak absorption wavelengths ($\lambda_{peak}$) and full width at half maximum (FWHM) of absorption spectra.

The electrical characteristics are evaluated from external quantum efficiency (EQE) and a dark current under a reverse bias voltage. The external quantum efficiency (EQE) may be evaluated from external quantum efficiency (EQE) at the peak absorption wavelength ($\lambda_{peak}$), such EQE at the peak absorption wavelength being referred to as $EQE_{max}$, after being allowed to stand at 85° C. for 1 hour, which may be Incident Photon to Current Efficiency (IPCE) at blue (450 nm, B), green (530 nm, G), and red (630 nm, R) wavelengths at 3 V. The dark current is evaluated by measuring a dark current with current-voltage evaluation device (Keithley K4200 parameter analyzer) after allowed to stand for 1 hour at 85° C. and dividing it by a unit pixel area (0.04 $cm^2$), and dark current density is evaluated from a current flowing when a reverse bias of −3 V is applied thereto.

The results are shown in Tables 3 and 4.

TABLE 3

| | $\lambda_{peak}$ (nm) | FWHM (nm) |
|---|---|---|
| Example 1 | 535 | 99 |
| Reference Example 1-1 | 528 | 110 |
| Reference Example 1-2 | 530 | 115 |
| Example 2 | 521 | 90 |
| Example 3 | 530 | 89 |

TABLE 4

| | $EQE_{max}$ (@-3 V, %) | $EQE_{max}$ (@-3 V, 85° C. 1 h, %) | EQE (@-3 V, 85° C. 1 h, %) | D.C (mA/$cm^2$) |
|---|---|---|---|---|
| Example 1 | 11.0 | 16.1 | 15.5 | $5.0 \times 10^{-6}$ |
| Reference Example 1-1 | 3.2 | 3.1 | 2.9 | — |
| Reference Example 1-2 | 3.6 | 3.3 | 3.0 | — |
| Example 2 | 6.1 | 6.8 | 5.7 | $4.3 \times 10^{-6}$ |
| Example 3 | 18.1 | 24.8 | 23.4 | $2.7 \times 10^{-5}$ |

Referring to Tables 3 and 4, the photosensors of Examples 1 to 3 exhibit improved optical electrical characteristics relative to Reference Examples 1-1 and 1-2.

While the inventive concepts have been described in connection with what is presently considered to be practical example embodiments, it is to be understood that the inventive concepts are not limited to such example embodiments. On the contrary, the inventive concepts are intended to cover various modifications and equivalent arrangements included within the spirit and scope of the appended claims.

What is claimed is:

1. A sensor-embedded display panel, comprising:

a light emitting element on a substrate, the light emitting element including a light emitting layer, and a photosensor on the substrate, the photosensor including a photosensitive layer, the photosensitive layer extending at least partially in parallel with the light emitting layer along an in-plane direction of the substrate, wherein the light emitting element and the photosensor each include a separate portion of a first common auxiliary layer extending continuously as a single first piece of material under each of the light emitting layer and the photosensitive layer; and a separate portion of a second common auxiliary layer extending continuously as a single second piece of material on each of the light emitting layer and the photosensitive layer, wherein the photosensitive layer includes a light absorbing semiconductor having a HOMO energy level having a difference of less than about 1.0 eV from a HOMO energy level of the first common auxiliary layer and a LUMO energy level having a difference of less than about 1.0 eV from a LUMO energy level of the second common auxiliary layer, wherein the photosensitive layer does not include any counterpart semiconductor for any pn junction with the light absorbing semiconductor, wherein the light absorbing semiconductor is an organic light absorbing material, and wherein the organic light absorbing material is represented by at least one of Chemical Formula 1:

[Chemical Formula 1]

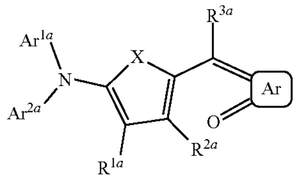

wherein, in Chemical Formula 1,

X is O, S, Se, Te, SO, $SO_2$, $CR^bR^c$, or $SiR^dR^e$,

Ar is a substituted or unsubstituted C6 to C30 arylene group, a substituted or unsubstituted C3 to C30 heterocyclic group, or fused rings thereof, $Ar^{1a}$ and $Ar^{2a}$ are each independently a substituted or unsubstituted C6 to C30 aryl(ene) group or a substituted or unsubstituted C3 to C30 heteroaryl(ene) group, $R^{1a}$ to $R^{3a}$ and $R^b$ to $R^e$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or any combination thereof, and $Ar^{1a}$, $Ar^{2a}$, $R^{1a}$, and $R^{2a}$ are each independently present, or two adjacent ones of $Ar^{1a}$, $Ar^{2a}$, $R^{1a}$, and $R^{2a}$ are linked to each other to form a ring, and wherein the light emitting layer includes an organic light emitting material, and difference between respective sublimation temperatures of the organic light absorbing material and the organic light emitting material is greater than or equal to about 0° C. and less than about 100° C.

2. The sensor-embedded display panel of claim 1, wherein the photosensitive layer is a single layer formed of a single continuous phase of the light absorbing semiconductor.

3. The sensor-embedded display panel of claim 1, wherein the photosensitive layer is formed of the light absorbing semiconductor.

4. The sensor-embedded display panel of claim 1, wherein an energy bandgap of the photosensitive layer is narrower than each of an energy bandgap of the first common auxiliary layer and an energy bandgap of the second common auxiliary layer.

5. The sensor-embedded display panel of claim 1, wherein the light absorbing semiconductor is configured to selectively absorb light of a red wavelength spectrum, a green wavelength spectrum, a blue wavelength spectrum, an infrared wavelength spectrum, or any combination thereof.

6. The sensor-embedded display panel of claim 1, wherein the photosensitive layer and the second common auxiliary layer are in contact with each other.

7. The sensor-embedded display panel of claim 1, wherein the photosensitive layer and the first common auxiliary layer are in contact with each other.

8. The sensor-embedded display panel of claim 1, further comprising:

a first pixel electrode included in the light emitting element, the first pixel electrode being under the first common auxiliary layer, a second pixel electrode included in the photosensor, the second pixel electrode being under the first common auxiliary layer, and a common electrode facing the first pixel electrode and the second pixel electrode, respectively, the common electrode being configured to apply a common voltage to the light emitting element and the photosensor, wherein the common electrode comprises a semi-transmissive layer forming a microcavity with the first pixel electrode and the second pixel electrode, respectively.

9. The sensor-embedded display panel of claim 8, further comprising an optical auxiliary layer between the photosensitive layer and the first common auxiliary layer.

10. The sensor-embedded display panel of claim 9, wherein the optical auxiliary layer is thicker than the photosensitive layer.

11. The sensor-embedded display panel of claim 9, wherein the photosensitive layer is configured to selectively absorb light of a first wavelength spectrum that is one of a red wavelength spectrum, a green wavelength spectrum, a blue wavelength spectrum, an infrared wavelength spectrum, or any combination thereof, and the optical auxiliary layer has a thickness which configures the photosensor to have a resonance wavelength belonging to the first wavelength spectrum.

12. The sensor-embedded display panel of claim 1, wherein the light emitting element comprises a first light emitting element, a second light emitting element, and a third light emitting element configured to emit light of different wavelength spectra from each other, and the photosensor is configured to:

absorb light that is emitted from at least one of the first light emitting element, the second light emitting element, or the third light emitting element and then reflected by a recognition target as an absorbed light, and convert the absorbed light into an electrical signal.

13. The sensor-embedded display panel of claim 1, wherein the sensor-embedded display panel comprises:

a display area configured to display a color, and a non-display area excluding the display area, wherein the light emitting element is in the display area and the photosensor is in the non-display area.

14. The sensor-embedded display panel of claim 13, wherein the light emitting element comprises a first light emitting element configured to emit light of a red wavelength spectrum, a second light emitting element configured to emit light of a green wavelength spectrum, and a third light emitting element configured to emit light of a blue wavelength spectrum, the display area comprises a plurality of first subpixels comprising the first light emitting element and configured to display light of the red wavelength spectrum, a plurality of second subpixels comprising the second light emitting element and configured to display light of the green wavelength spectrum, and a plurality of third subpixels comprising the third light emitting element and configured to display light of the blue wavelength spectrum, and the photosensor is between at least two subpixels of a first subpixel of the plurality of first subpixels, a second subpixel of the plurality of second subpixels, or a third subpixel of the plurality of third subpixels.

15. An electronic device comprising the sensor-embedded display panel of claim 1.

* * * * *